United States Patent
Fukuda

(10) Patent No.: US 10,205,126 B2
(45) Date of Patent: Feb. 12, 2019

(54) LIGHT EMISSION DEVICE INCLUDING LIGHT EXTRACTION PLANE AND A PLURALITY OF REFLECTION INTERFACES, DISPLAY APPARATUS INCLUDING THE LIGHT EMISSION DEVICE, AND ILLUMINATION APPARATUS INCLUDING THE LIGHT EMISSION DEVICE

(71) Applicant: JOLED INC., Tokyo (JP)

(72) Inventor: Toshihiro Fukuda, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 15/782,826

(22) Filed: Oct. 12, 2017

(65) Prior Publication Data
US 2018/0151840 A1    May 31, 2018

(30) Foreign Application Priority Data

Nov. 29, 2016  (JP) .................................. 2016-231492

(51) Int. Cl.
*H01L 51/52*   (2006.01)
*H01L 27/32*   (2006.01)

(52) U.S. Cl.
CPC ........ *H01L 51/5265* (2013.01); *H01L 27/322* (2013.01); *H01L 27/3211* (2013.01); *H01L 51/5271* (2013.01); *H01L 2251/5315* (2013.01)

(58) Field of Classification Search
CPC ............. H01L 27/3202; H01L 27/3204; H01L 27/3206; H01L 51/5265; H01L 51/5271; H01L 27/3211; H01L 27/322; H01L 2251/5315; H01L 27/14629
See application file for complete search history.

(56) References Cited

U.S. PATENT DOCUMENTS

| 7,102,282 | B1 |   | 9/2006 | Yamada et al. |
|---|---|---|---|---|
| 8,253,325 | B2 | * | 8/2012 | Mizuno .................. C09K 11/06 313/503 |
| 8,860,302 | B2 |   | 10/2014 | Fukuda et al. |

(Continued)

FOREIGN PATENT DOCUMENTS

| JP | 2006-244713 A | 9/2006 |
|---|---|---|
| JP | 2011-159431 A | 8/2011 |

(Continued)

*Primary Examiner* — Thanh Y Tran
(74) *Attorney, Agent, or Firm* — Hauptman Ham, LLP

(57) ABSTRACT

Provided is a light emission device including: first and second light emission element regions; first to fourth reflection interfaces; a light extraction plane; and first and second light emission layers. The first reflection interface is provided in the first and second light emission element regions. The light extraction plane is provided in confronted relation to the first reflection plane. The second reflection interface allows reflection therefrom to cause reinforcement with respect to center wavelengths of light emission spectra of the first and second light emission layers. The third and fourth reflection interfaces allow reflection therefrom to cause attenuation with respect to the center wavelength of the light emission spectrum of the first light emission layer, and to cause reinforcement with respect to the center wavelength of the light emission spectrum of the second light emission layer.

17 Claims, 21 Drawing Sheets

(56) References Cited

U.S. PATENT DOCUMENTS

2008/0054797 A1* 3/2008 Furugori ............... C09K 11/06
 313/504
2011/0187260 A1 8/2011 Fukuda et al.

FOREIGN PATENT DOCUMENTS

| JP | 2011-159433 A | 8/2011 |
| WO | 01039554 A1 | 5/2001 |

* cited by examiner

LIGHT EMISSION DEVICE INCLUDING LIGHT EXTRACTION PLANE AND A PLURALITY OF REFLECTION INTERFACES, DISPLAY APPARATUS INCLUDING THE LIGHT EMISSION DEVICE, AND ILLUMINATION APPARATUS INCLUDING THE LIGHT EMISSION DEVICE

CROSS REFERENCE TO RELATED APPLICATIONS

This application claims the benefit of Japanese Priority Patent Application JP 2016-231492 filed on Nov. 29, 2016, the entire contents of which are incorporated herein by reference.

BACKGROUND

The disclosure relates to a light emission device, a display apparatus, and an illumination apparatus that utilize, for example, organic electroluminescence elements that emit light by an organic electroluminescence (EL) phenomenon.

In recent years, many proposals have been made regarding a structure of a light emission device that utilizes organic EL elements. For example, reference is made to International Publication No. WO01/039554, and Japanese Unexamined Patent Application Publication Nos. 2006-244713, 2011-159431, and 2011-159433.

SUMMARY

In the light emission device as mentioned above, desired is enhancement in a light distribution characteristic.

It is desirable to provide a light emission device, a display apparatus, and an illumination apparatus that make it possible to enhance a light distribution characteristic.

According to an embodiment of the disclosure, there is provided a light emission device including: a first light emission element region and a second light emission element region, a first reflection interface, a light extraction plane, a first light emission layer, a second light emission layer, a second reflection interface, a third reflection interface, and a fourth reflection interface. The first reflection interface is provided in the first light emission element region and the second light emission element region. The light extraction plane is provided in confronted relation to the first reflection interface. The first light emission layer is provided between the first reflection interface and the light extraction plane of the first light emission element region. The second light emission layer is provided between the first reflection interface and the light extraction plane of the second light emission element region. The second reflection interface is provided between the first light emission layer and the light extraction plane, and between the second light emission layer and the light extraction plane. The second reflection interface is configured to allow reflection from the second reflection interface to cause reinforcement with respect to center wavelengths of light emission spectra of the first light emission layer and the second light emission layer. The third reflection interface is provided between the second reflection interface and the light extraction plane. The third reflection interface is configured to allow reflection from the third reflection interface to cause attenuation with respect to the center wavelength of the light emission spectrum of the first light emission layer, and to cause reinforcement with respect to the center wavelength of the light emission spectrum of the second light emission layer. The fourth reflection interface is provided between the third reflection interface and the light extraction plane. The fourth reflection interface is configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

According to an embodiment of the disclosure, there is provided a display apparatus including a light emission device and drive elements that drive the light emission device on a pixel basis. The light emission device includes a first light emission element region and a second light emission element region, a first reflection interface, a light extraction plane, a first light emission layer, a second light emission layer, a second reflection interface, a third reflection interface, and a fourth reflection interface. The first reflection interface is provided in the first light emission element region and the second light emission element region. The light extraction plane is provided in confronted relation to the first reflection interface. The first light emission layer is provided between the first reflection interface and the light extraction plane of the first light emission element region. The second light emission layer is provided between the first reflection interface and the light extraction plane of the second light emission element region. The second reflection interface is provided between the first light emission layer and the light extraction plane, and between the second light emission layer and the light extraction plane. The second reflection interface is configured to allow reflection from the second reflection interface to cause reinforcement with respect to center wavelengths of light emission spectra of the first light emission layer and the second light emission layer. The third reflection interface is provided between the second reflection interface and the light extraction plane. The third reflection interface is configured to allow reflection from the third reflection interface to cause attenuation with respect to the center wavelength of the light emission spectrum of the first light emission layer, and to cause reinforcement with respect to the center wavelength of the light emission spectrum of the second light emission layer. The fourth reflection interface is provided between the third reflection interface and the light extraction plane. The fourth reflection interface is configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

According to an embodiment of the disclosure, there is provided an illumination apparatus including a light emission device. The light emission device includes a first light emission element region and a second light emission element region, a first reflection interface, a light extraction plane, a first light emission layer, a second light emission layer, a second reflection interface, a third reflection interface, and a fourth reflection interface. The first reflection interface is provided in the first light emission element region and the second light emission element region. The light extraction plane is provided in confronted relation to the first reflection interface. The first light emission layer is provided between the first reflection interface and the light extraction plane of the first light emission element region. The second light emission layer is provided between the first reflection interface and the light extraction plane of the second light emission element region. The second reflection interface is provided between the first light emission layer and the light extraction plane, and between the second light emission layer and the light extraction plane. The second reflection interface is configured to allow reflection from the second reflection interface to cause reinforcement with respect to center wavelengths of light emission spectra of the first light emission layer and the second light emission layer. The third reflection interface is provided between the second reflection interface and the light extraction plane. The third reflection interface is configured to allow reflection from the third reflection interface to cause attenuation with respect to the center wavelength of the light emission spectrum of the first light emission layer, and to cause reinforcement with respect to the center wavelength of the light emission spectrum of the second light emission layer. The fourth reflection interface is provided between the third reflection interface and the light extraction plane. The fourth reflection interface is configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

In the light emission device, the display apparatus, and the illumination apparatus according to the embodiments of the disclosure, the third reflection interface and the fourth reflection interface are configured to allow reflection therefrom to cause the attenuation with respect to the center wavelength of the light emission spectrum of the first light emission layer, and to cause the reinforcement with respect to the center wavelength of the light emission spectrum of the second light emission layer. Thus, it is possible to provide a difference between the first light emission element region and the second light emission element region, in conditions of the reflection from the third reflection interface and the fourth reflection interface. Hence, a light emission state is adjusted for each light emission element region.

According to the light emission device, the display apparatus, and the illumination apparatus in the embodiments of the disclosure, provided is the difference between the first light emission element region and the second light emission element region, in the conditions of the reflection from the third reflection interface and the fourth reflection interface. This makes it possible to adjust the light emission state for each light emission element region. Hence, it is possible to enhance the light distribution characteristic. It is to be noted that effects of the disclosure are not necessarily limited to the effects described above, and may include any of effects that are described herein.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some embodiments of the disclosure are described in detail with reference to the accompanying drawings. Description is made in the following order.

1. Embodiment (examples of a light emission device of a top emission type, including first to fourth reflection interfaces)
2. Modification Example 1 (an example with the use of a metal layer)
3. Modification Example 2 (an example with a fifth reflection interface)
4. Modification Example 3 (an example of a light emission device of a bottom emission type)
5. Application Example 1 (examples of a display apparatus and an electronic apparatus)
6. Application Example 2 (an example of an illumination apparatus)

Embodiment

[Configuration]

Figure 1:
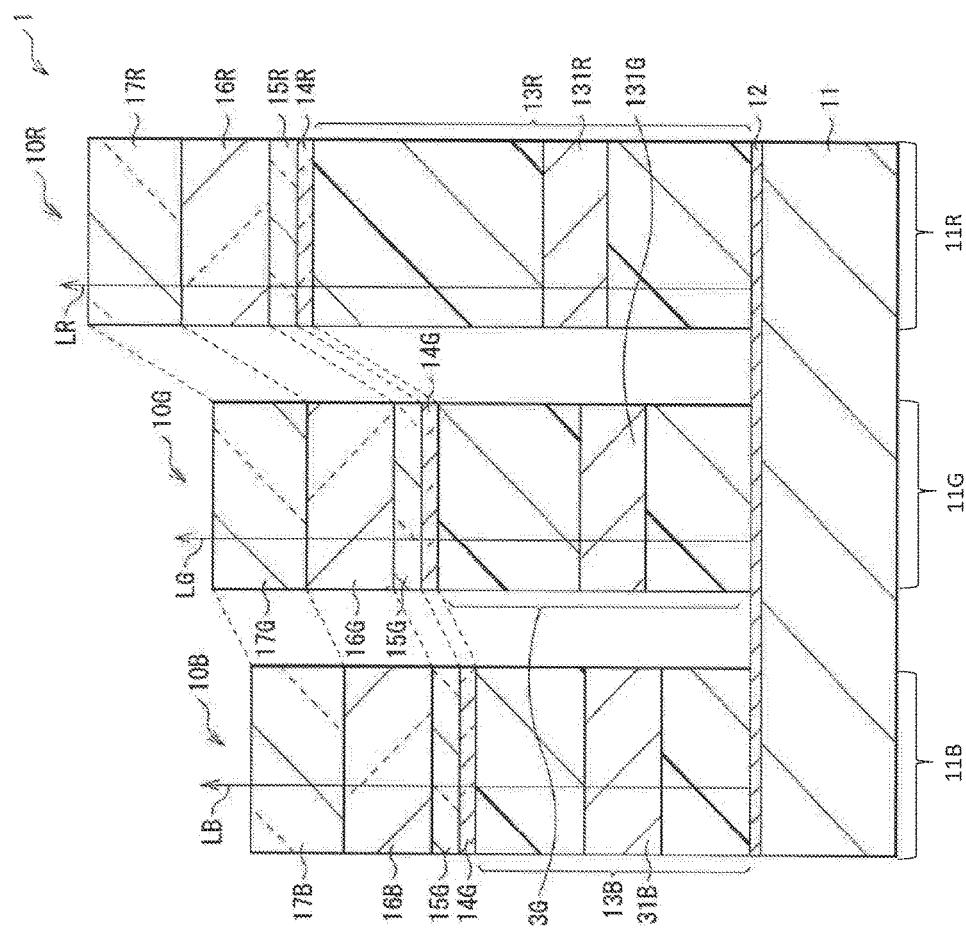
FIG. 1 is a cross-sectional view of a schematic configuration of a light emission device according to one embodiment of the disclosure.

FIG. 1 illustrates a cross-sectional configuration of a main part of a light emission device, e.g., a light emission device 1, according to one embodiment of the disclosure. The light emission device 1 may include a substrate 11. The substrate 11 may be provided with a red light emission element region 11R, a green light emission element region 11G, and a blue light emission element region 11B. The light emission device 1 may include a red organic EL element 10R, a green organic EL element 10G, and a blue organic EL element 10B. The red organic EL element 10R is provided in the red light emission element region 11R. The green organic EL element 10G is provided in the green light emission element region 11G. The blue organic EL element 10B is provided in the blue light emission element region 11B.

In one embodiment of the disclosure, the red light emission element region 11R corresponds to one specific example of a "first light emission element region". In one embodiment of the disclosure, the blue light emission element region 11B corresponds to one specific example of a "second light emission element region".

The red organic EL element 10R, the green organic EL element 10G, and the blue organic EL element 10B may be provided on the substrate 11. The red organic EL element 10R may include, on the substrate 11, a first electrode 12, a red organic layer 13R including a red light emission layer 131R, a semi-transparent reflection layer 14R, a first transparent layer 15R, a second transparent layer 16R, and a third transparent layer 17R in this order. The green organic EL element 10G may include, on the substrate 11, the first electrode 12, a green organic layer 13G including a green light emission layer 131G, a semi-transparent reflection layer 14G, a first transparent layer 15G, a second transparent layer 16G, and a third transparent layer 17G in this order. The blue organic EL element 10B may include, on the substrate 11, the first electrode 12, a blue organic layer 13B including a blue light emission layer 131B, a semi-transparent reflection layer 14B, a first transparent layer 15B, a second transparent layer 16B, and a third transparent layer 17B in this order.

The red organic EL element 10R may emit light of a red wavelength range, i.e., red light LR, through side on which the third transparent layer 17R is disposed. The red light LR is generated in the red light emission layer 131R. The green organic EL element 10G may emit light of a green wavelength range, i.e., green light LG, through side on which the third transparent layer 17G is disposed. The green light LG is generated in the green light emission layer 131G. The blue organic EL element 10B may emit light of a blue wavelength range, i.e., blue light LB, through side on which the third transparent layer 17B is disposed. The blue light LB is generated in the blue light emission layer 131B. The light emission device 1 is configured to cause multiple reflection of the light emitted from the red light emission layer 131R between the first electrode 12 and the third transparent layer 17R, to cause multiple reflection of the light emitted from the green light emission layer 131G between the first electrode 12 and the third transparent layer 17G, to cause multiple reflection of the light emitted from the blue light emission layer 131B between the first electrode 12 and the third transparent layer 17B, and to extract the resultant light. In other words, the light emission device 1 may be a light emission device of a top emission type including a cavity structure.

The substrate 11 may be a plate member that supports the red organic EL element 10R, the green organic EL element 10G, and the blue organic EL element 10B. The substrate 11 may be constituted by, for example, a transparent glass substrate or a semiconductor substrate. The substrate 11 may be constituted by a flexible substrate.

The first electrode 12 may serve as an anode, and have a function of a reflection layer. The first electrode 12 may be provided, for example, in common for the red light emission element region 11R, the green light emission element region 11G, and the blue light emission element region 11B. For the first electrode 12, for example, a light reflective material such as aluminum (Al) and its alloys, platinum (Pt), gold (Au), chromium (Cr), and tungsten (W) may be used. The first electrode 12 may be constituted by a stack of a transparent conductive material and the light reflective material. In one preferable but non-limiting example, a thickness of the first electrode 12 may range from 100 nm to 300 nm both inclusive.

The red organic layer 13R may include, for example, a hole injection layer, a hole transportation layer, the red light emission layer 131R, an electron transportation layer, and an electron injection layer in the order of closeness to the first electrode 12. The green organic layer 13G may include, for example, the hole injection layer, the hole transportation layer, the green light emission layer 131G, the electron transportation layer, and the electron injection layer in the order of the closeness to the first electrode 12. The blue organic layer 13B may include, for example, the hole injection layer, the hole transportation layer, the blue light emission layer 131B, the electron transportation layer, and the electron injection layer in the order of the closeness to the first electrode 12.

The hole injection layer may be a layer that prevents leakage, and be made of, for example, hexaazatriphenylene (HAT). A thickness of the hole injection layer may be, for example, 1 nm to 20 nm both inclusive. The hole transportation layer may be made of, for example, α-NPD [N,N'-di(1-naphthyl)-N,N'-diphenyl-[1,1'-biphynyl]-4,4'-diamine]. A thickness of the hole transportation layer may be, for example, 15 nm to 100 nm both inclusive.

The red light emission layer 131R, the green light emission layer 131G, and the blue light emission layer 131B are each configured to emit light of a predetermined color by recombination of holes and electrons, and each have a thickness of, for example, 5 nm to 50 nm both inclusive. The red light emission layer 131R may emit the light of the red wavelength range, and be made of, for example, rubrene doped with a pyrromethene boron complex. At this occasion, the rubrene is used as a host material. The green light emission layer 131G may emit the light of the green wavelength range, and be made of, for example, $Alq_3$ (a trisquinolinol aluminum complex). The blue light emission layer 131B may emit the light of the blue wavelength range, and be made of, for example, ADN (9,10-di(2-naphtyl) anthracene) doped with a diaminochrycene derivative. At this occasion, the ADN, as a host material, may be deposited with a thickness of, for example, 20 nm on the hole transportation layer, and be doped with the diaminochrycene derivative, a dopant, at a relative film thickness ratio of 5%.

The electron transportation layer may be made of BCP (2,9-dimethyl-4,7-diphenyl-1,10-phenanthroline). A thickness of the electron transportation layer may be, for example, 15 nm to 200 nm both inclusive. The electron injection layer may be made of, for example, lithium fluoride (LiF). A thickness of the electron injection layer may be, for example, 15 nm to 270 nm both inclusive.

The semi-transparent reflection layer 14R may be provided between the red organic layer 13R and the first transparent layer 15R. The semi-transparent reflection layer 14G may be provided between the green organic layer 13G and the first transparent layer 15G The semi-transparent reflection layer 14B may be provided between the blue organic layer 13B and the first transparent layer 15B. The semi-transparent reflection layers 14R, 14G, 14B may be provided as necessary, and be omitted. Instead of the semi-transparent reflection layers 14R, 14G, and 14B, transparent reflection layers may be provided. In one preferable but non-limiting example, the semi-transparent reflection layers 14R, 14G, and 14B may each have a thickness of 5 nm or more, and be made of, for example, magnesium (Mg), silver (Ag), or their alloys. The semi-transparent reflection layers 14R, 14G, and 14B may have a function as a second electrode or a cathode electrode that is paired with the first electrode 12. Providing the semi-transparent reflection layers 14R, 14G, and 14B having high reflectance makes it possible to increase effects of the cavity structure, leading to enhancement in efficiency of light extraction. This contributes to lower power consumption, and longer lives of the red organic EL element 10R, the green organic EL element 10G, and the blue organic EL element 10B.

The first transparent layers 15R, 15G, and 15B, the second transparent layers 16R, 16G, and 16B, and the third transparent layers 17R, 17G, and 17B may be provided on light-extraction side of the light emission device 1. A thickness of each of the first transparent layers 15R, 15G, and 15B may be, for example, 30 nm to 450 nm both inclusive. A thickness of each of the second transparent layers 16R, 16G, and 16B may be, for example, 30 nm to 380 nm both inclusive. A thickness of each of the third transparent layers 17R, 17G, and 17B may be, for example, 500 nm to 10000 nm both inclusive.

For the first transparent layers 15R, 15G, and 15B, the second transparent layers 16R, 16G, and 16B, and the third transparent layers 17R, 17G, and 17B, for example, a transparent conductive material or a transparent dielectric material may be used. Non-limiting examples of the transparent conductive material may include ITO (Indium Tin Oxide) and an oxide of indium and zinc (IZO). Non-limiting examples of the transparent dielectric material may include silicon oxide ($SiO_2$), silicon oxynitride (SiON), and silicon nitride (SiN). The first transparent layers 15R, 15G, and 15B, the second transparent layers 16R, 16G, and 16B, and the third transparent layers 17R, 17G, and 17B may have the function as the second electrode or the cathode electrode, or alternatively, they may serve as passivation films. The first transparent layers 15R, 15G, and 15B, the second transparent layers 16R, 16G, and 16B, and the third transparent layers 17R, 17G, and 17B may serve as the passivation films, with a second electrode or a cathode electrode being provided between the red light emission layer 131R and the first transparent layer 15R, between the green light emission layer 131G and the first transparent layer 15G, and between the blue light emission layer 131B and the first transparent layer 15B. For the first transparent layers 15R, 15G, and 15B, the second transparent layers 16R, 16G, and 16B, and the third transparent layers 17R, 17G, and 17B, a low refractive index material such as MgF and NaF may be used.

In one preferable but non-limiting example, a layer of a thickness of 1 μm or more may be provided at an upper level of the third transparent layers 17R, 17G, and 17B. The layer of the thickness of 1 μm or more may be made of, for example, a transparent conductive material, a transparent insulating material, a resin material, or glass. The layer of the thickness of 1 μm or more may be constituted by an air gap. Providing such a layer makes it possible to prevent interference between the cavity structure and its outside, with the cavity structure being formed between the first electrode 12 and the third transparent layers 17R, 17G, and 17B.

Figure 2A:
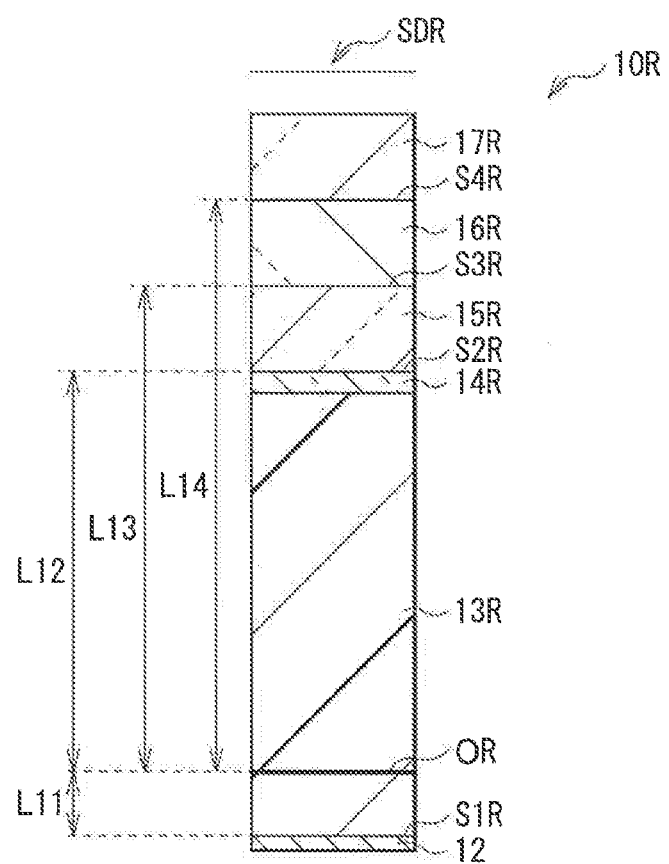
FIG. 2A is a cross-sectional view of a configuration of a red organic EL element illustrated in FIG. 1.
Figure 2B:
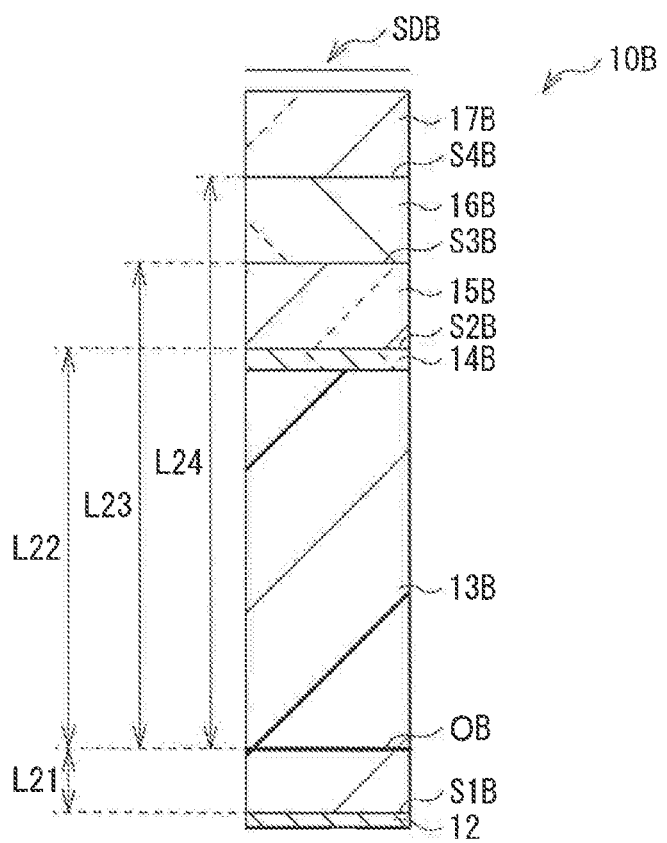
FIG. 2B is a cross-sectional view of a configuration of a blue organic EL element illustrated in FIG. 1.

Referring to FIGS. 2A and 2B, described is the cavity structure of the red organic EL element 10R, the green organic EL element 10G, and the blue organic EL element 10B.

As illustrated in FIG. 2A, the red organic EL element 10R includes a first reflection interface S1R, a second reflection interface S2R, a third reflection interface S3R, a fourth reflection interface S4R, and a light extraction plane SDR in this order from side on which the substrate 11 is disposed. Between the first reflection interface S1R and the second reflection interface S2R, provided may be a center OR of light emission of the red light emission layer 131R. In other words, the red light emission layer 131R may be provided between the first reflection interface S1R and the light extraction plane SDR that are in confronted relation to each other. For example, the first electrode 12 may be confronted with the red light emission layer 131R, with the first reflection interface S1R in between. The first transparent layer 15R may be provided between the red light emission layer 131R and the light extraction plane SDR.

As illustrated in FIG. 2B, the blue organic EL element 10B includes a first reflection interface S1B, a second reflection interface S2B, a third reflection interface S3B, a fourth reflection interface S4B, and a light extraction plane SDB in this order from the side on which the substrate 11 is disposed. Between the first reflection interface S1B and the second reflection interface S2B, provided may be a center OB of light emission of the blue light emission layer 131B. In other words, the blue light emission layer 131B may be provided between the first reflection interface S1B and the light extraction plane SDB that are in the confronted relation to each other. For example, the first electrode 12 may be confronted with the blue light emission layer 131B, with the first reflection interface S1B in between. The first transparent layer 15B may be provided between the blue light emission layer 131B and the light extraction plane SDB.

Although illustration is omitted, the green organic EL element 10G may also include a first reflection interface, a second reflection interface, a third reflection interface, a fourth reflection interface, and a light extraction plane in this order, as with the red organic EL element 10R and the blue organic EL element 10B. Between the first reflection interface and the second reflection interface, provided may be a center of light emission of the green light emission layer 131G. In other words, the first reflection interfaces, the centers of the light emission, the second reflection interfaces, the third reflection interfaces, the fourth reflection interfaces, and the light extraction planes may be provided in this order, over the red light emission element region 11R, the green light emission element region 11G, and the blue light emission element region 11B. The first reflection interfaces to the fourth reflection interfaces may each be constituted by an interface having a difference in refractive indexes of, for example, 0.15 or more.

The first reflection interface S1R may be an interface between, for example, the first electrode 12 and the red organic layer 13R. The first reflection interface S1B may be an interface between, for example, the first electrode 12 and the blue organic layer 13B. The first reflection interface S1R may be formed by the difference in the refractive indexes between the constituent material of the first electrode 12 and the constituent material of the red organic layer 13R. The first reflection interface S1B may be formed by the difference in the refractive indexes between the constituent material of the first electrode 12 and the constituent material of the blue organic layer 13B. For example, aluminum (Al) that constitutes the first electrode 12 has a refractive index of 0.73 and an extinction coefficient of 5.91. The red organic layer 13R and the blue organic layer 13B may each have a refractive index of 1.75. The first reflection interface S1R may be located at an optical distance L11 from the center OR of the light emission. The first reflection interface S1B may be located at an optical distance L21 from the center OB of the light emission.

The optical distance L11 is so set as to cause reinforcement of light of a center wavelength λ1 of a light emission spectrum of the red light emission layer 131R, by interference between the first reflection interface S1R and the center OR of the light emission. The optical distance L21 is so set as to cause reinforcement of light of a center wavelength λ2 of a light emission spectrum of the blue light emission layer 131B, by interference between the first reflection interface S1B and the center OB of the light emission.

In one specific but non-limiting example, the optical distances L11 and L21 are configured to satisfy the following expressions [1], [5], [9], and [13]. The optical distance L11 may be, for example, 125 nm. The optical distance L21 may be, for example, 88 nm.

$$2L11/\lambda 11 + a1/(2\pi) = m1 (m1 \geq 0) \quad [1]$$

$$\lambda 1 - 150 < \lambda 11 < \lambda 1 + 80 \quad [5]$$

$$2L21/\lambda 21 + c1/(2\pi) = n1 (n1 \geq 0) \quad [9]$$

$$\lambda 2 - 150 < \lambda 21 < \lambda 2 + 80 \quad [13]$$

where m1 and n1 are integral numbers,
λ1, λ11, λ2, and λ21 are in units of nm,
a1 is a phase change generated in reflection of light of any wavelength from the first reflection interface S1R, the light being emitted from the red light emission layer 131R, and
c1 is a phase change generated in reflection of light of any wavelength from the first reflection interface S1B, the light being emitted from the blue light emission layer 131B.

In the forgoing, a1 and c1 may be calculated with the use of n0 and k in a complex refractive index N=n0−jk (where n0 is a refractive index and k is an extinction coefficient) of the constituent material of the first electrode 12, and the refractive indexes of the red organic layer 13R and the blue organic layer 13B. For example, refer to "Principles of Optics", Max Born and Emil Wolf, 1974, PERGAMON PRESS. The refractive indexes of the materials may be measured with the use of a spectral ellipsometry measurement device.

In one preferable but non-limiting example, m may equal to 0 (m=0) and n1 may equal to 0 (n1=0), since so-called microcavity effects are not produced, with values of m1 and n1 being large. For example, the optical distance L11 may satisfy both of the following expressions [17] and [18].

$$2L11/\lambda 11 + a1/(2\pi) = 0 \quad [17]$$

$$\lambda 1 - 150 = 450 < \lambda 11 = 600 < \lambda 1 + 80 = 680 \quad [18]$$

Figure 3:
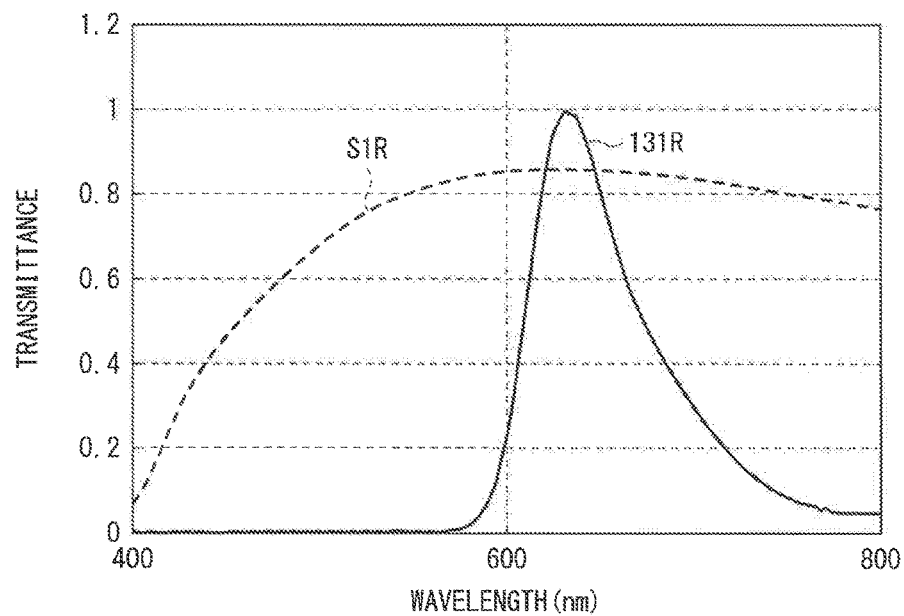
FIG. 3 illustrates transmittance of light reflected from a first reflection interface illustrated in FIG. 2A.

FIG. 3 illustrates transmittance (a broken line) of light reflected from the first reflection interface S1R, together with a light emission spectrum (a solid line) of the red light emission layer 131R. The first reflection interface S1R that satisfies the expression [17], being provided at a position of zero-order interference, exhibits high transmittance over a wide wavelength range. Accordingly, as given in the expression [18], λ11 may be largely shifted from the center wavelength λ1.

The second reflection interface S2R is provided between the center OR of the light emission, i.e., the red light emission layer 131R, and the light extraction plane SDR, and may be constituted by, for example, the semi-transparent reflection layer 14R as a thin film. The second reflection interface S2B is provided between the center OB of the light emission, i.e., the blue light emission layer 131B, and the light extraction plane SDB, and may be constituted by, for example, the semi-transparent reflection layer 14B as a thin film. The second reflection interface S2R may be formed by the difference in the refractive indexes between the constituent material of the red organic layer 13R and the constituent material of the semi-transparent reflection layer 14R. The second reflection interface S2B may be formed by the difference in the refractive indexes between the constituent material of the blue organic layer 13B and the constituent material of the semi-transparent reflection layer 14B. For example, the red organic layer 13R and the blue organic layer 13B may each have the refractive index of 1.75. Silver (Ag) that constitutes the semi-transparent reflection layers 14R and 14B has a refractive index of 0.13 and an extinction coefficient of 3.96. The second reflection interface S2R may be located at an optical distance L12 from the center OR of the light emission. The second reflection interface S2B may be located at an optical distance L22 from the center OB of the light emission.

The optical distance L12 is so set as to cause reinforcement of the light of the center wavelength λ1 of the light emission spectrum of the red light emission layer 131R, by interference between the second reflection interface S2R and the center OR of the light emission. The optical distance L22 is so set as to cause reinforcement of the light of the center wavelength λ2 of the light emission spectrum of the blue light emission layer 131B, by interference between the second reflection interface S2B and the center OB of the light emission.

In one specific but non-limiting example, the optical distances L12 and L22 are configured to satisfy the following expressions [2], [6], [10], and [14]. The optical distance L12 may be, for example, 390 nm. The optical distance L22 may be, for example, 230 nm.

$$2L12/\lambda12+a2/(2\pi)=m2 \quad [2]$$

$$\lambda1-80<\lambda12<\lambda1+80 \quad [6]$$

$$2L22/\lambda22+c2/(2\pi)=n2 \quad [10]$$

$$\lambda2-80<\lambda22<\lambda2+80 \quad [14]$$

where m2 and n2 are integral numbers,

λ1, λ12, λ2, and λ22 are in units of nm, a2 is a phase change generated in reflection of light of any wavelength from the second reflection interface S2R, the light being emitted from the red light emission layer 131R, and c2 is a phase change generated in reflection of light of any wavelength from the second reflection interface S2B, the light being emitted from the blue light emission layer 131B.

In the forgoing, a2 and c2 may be obtained in a similar method to those of a1 and c1.

In one preferable but non-limiting example, m2 may equal to 1 (m2=1), and n2 may equal to 1 (n2=1), since the so-called microcavity effects are not produced, with values of m2 and n2 being large.

Figure 4:
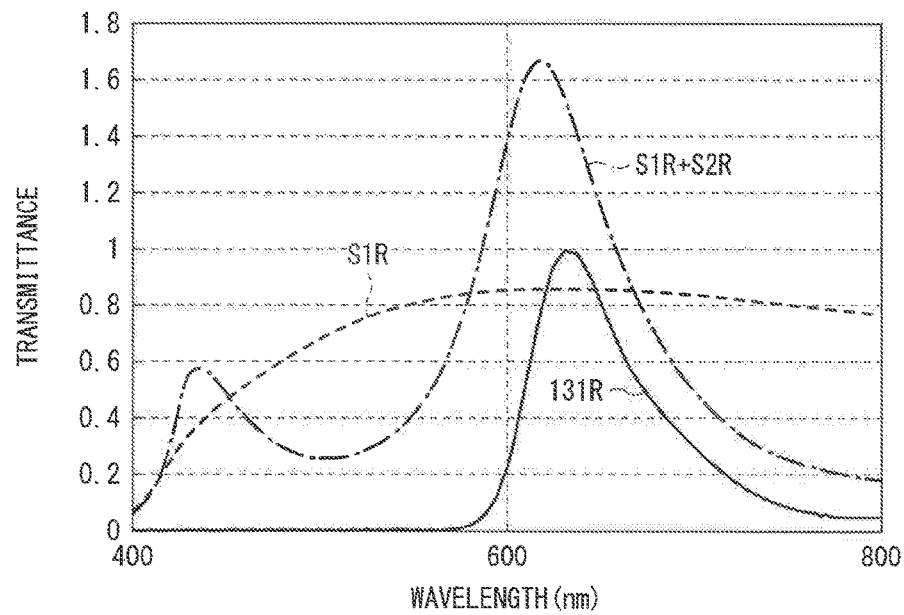
FIG. 4 illustrates transmittance of light reflected from the first reflection interface and a second reflection interface, as superimposed on FIG. 3.

FIG. 4 illustrates transmittance (a dash-dot line) of light reflected from the second reflection interface S2R, as added to FIG. 3. The first reflection interface S1R and the second reflection interface S2R are both configured to cause the reinforcement of the light generated in the red light emission layer 131R, between themselves and the center OR of the light emission. This amplification effect causes generation of a peak of the transmittance in the vicinity of 620 nm.

Figure 5:
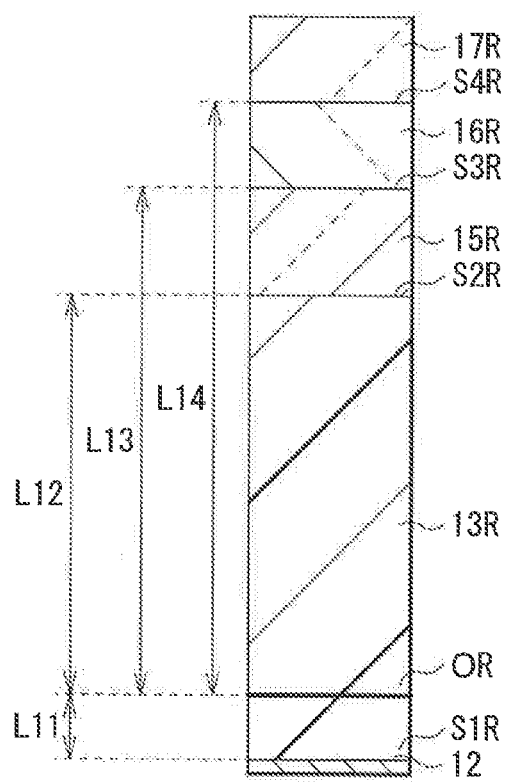
FIG. 5 is a cross-sectional view of another example (1) of the second reflection interface illustrated in FIG. 2A.

As illustrated in FIG. 5, the second reflection interface S2R may be constituted by an interface between the red organic layer 13R and the first transparent layer 15R, without providing the semi-transparent reflection layer 14R. The second reflection interface S2B may be constituted by an interface between the blue organic layer 13B and the first transparent layer 15B, without providing the semi-transparent reflection layer 14B.

Figure 6:
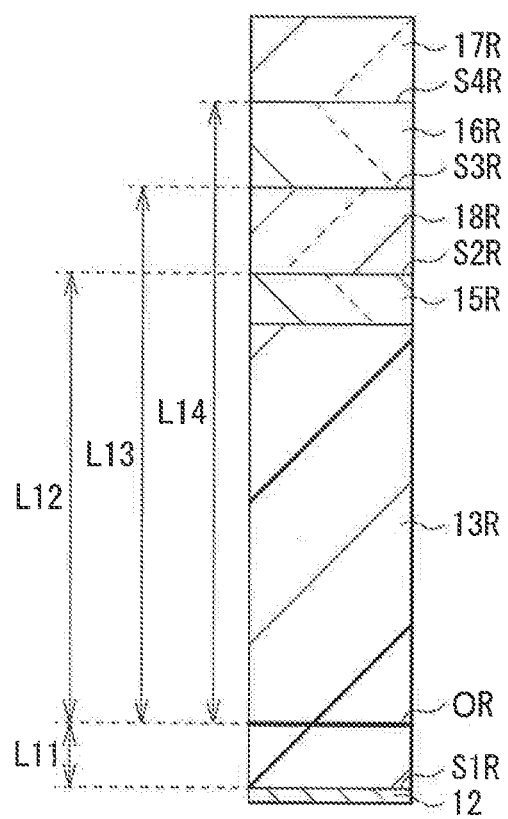
FIG. 6 is a cross-sectional view of another example (2) of the second reflection interface illustrated in FIG. 2A.

As illustrated in FIG. 6, a fourth transparent layer 18R may be provided between the first transparent layer 15R and the second transparent layer 16R, to constitute the second reflection interface S2R between the fourth transparent layer 18R and the first transparent layer 15R. A fourth transparent layer 18B may be provided between the first transparent layer 15B and the second transparent layer 16B, to constitute the second reflection interface S2B between the fourth transparent layer 18B and the first transparent layer 15B.

The third reflection interface S3R is provided between the second reflection interface S2R and the light extraction plane SDR, and may be constituted by, for example, an interface between the first transparent layer 15R and the second transparent layer 16R. The third reflection interface S3B is provided between the second reflection interface S2B and the light extraction plane SDB, and may be constituted by, for example, an interface between the first transparent layer 15B and the second transparent layer 16B. The third reflection interface S3R may be formed by the difference in the refractive indexes between the constituent material of the first transparent layer 15R and the constituent material of the second transparent layer 16R. The third reflection interface S3B may be formed by the difference in the refractive indexes between the constituent material of the first transparent layer 15B and the constituent material of the second transparent layer 16B. For example, silicon nitride (SiN) that constitutes the first transparent layers 15R and 15B has a refractive index of 1.95. Silicon oxynitride (SiON) that constitutes the second transparent layers 16R and 16B has a refractive index of 1.65. The first transparent layers 15R and 15B may be constituted by IZO having a refractive index of 2.0. The third reflection interface S3R may be located at an optical distance L13 from the center OR of the light emission. The third reflection interface S3B may be located at an optical distance L23 from the center OB of the light emission. In one preferable but non-limiting example, the third reflection interface S3R may be located at an optical distance of 450 nm or less from the second reflection interface S2R. The third reflection interface S3B may be located at an optical distance of 450 nm or less from the second reflection interface S2B. This is because effects of the cavity structure are not produced, with a distance from the second reflection interface S2R to the third reflection interface S3R and a distance from the second reflection interface S2B to the third reflection interface S3B being large.

As illustrated in FIG. 6, the third reflection interface S3R may be constituted by an interface between the fourth transparent layer 18R and the second transparent layer 16R.

The fourth reflection interface S4R is provided between the third reflection interface S3R and the light extraction plane SDR, and may be constituted by, for example, an interface between the second transparent layer 16R and the third transparent layer 17R. The fourth reflection interface S4B is provided between the third refection interface S3B and the light extraction plane SDB, and may be constituted by, for example, an interface between the second transparent layer 16B and the third transparent layer 17B. The fourth reflection interface S4R may be formed by the difference in the refractive indexes between the constituent material of the second transparent layer 16B and the constituent material of the third transparent layer 17R. The fourth reflection interface S4B may be formed by the difference in the refractive indexes between the constituent material of the second transparent layer 16B and the constituent material of the third transparent layer 17B. Silicon oxynitride (SiON) that constitutes the second transparent layers 16R and 16B has the refractive index of 1.65. Silicon nitride (SiN) that constitutes the third transparent layers 17R and 17B has a refractive index of 1.95. The fourth reflection interface S4R may be located at an optical distance L14 from the center OR of the light emission. The fourth reflection interface S4B may be located at an optical distance L24 from the center OB of the light emission. In one preferable but non-limiting example, the fourth reflection interface S4R may be located at an optical distance of 380 nm or less from the second reflection interface S2R. The fourth reflection interface S4B may be located at an optical distance of 380 nm or less from the second reflection interface S2B. This is because the effects of the cavity structure are not produced, with a distance from the second reflection interface S2R to the fourth reflection interface S4R and a distance from the second reflection interface S2B to the fourth reflection interface S4B being large.

The third reflection interfaces S3R and S3B, and the fourth reflection interfaces S4R and S4B may be formed by a stack of metal thin films each having a thickness of, for example, 5 nm or more.

In the light emission device 1 according to this embodiment, the optical distance L13 is so set as to cause attenuation of the light of the center wavelength λ1 of the light emission spectrum of the red light emission layer 131R, by interference between the third reflection interface S3R and the center OR of the light emission. The optical distance L23 is so set as to cause reinforcement of the light of the center wavelength λ2 of the light emission spectrum of the blue light emission layer 131B, by interference between the third reflection interface S3B and the center OB of the light emission.

Moreover, the optical distance L14 is so set as to cause attenuation of the light of the center wavelength λ1 of the light emission spectrum of the red light emission layer 131R, by interference between the fourth reflection interface S4R and the center OR of the light emission. The optical distance L24 is so set as to cause reinforcement of the light of the center wavelength λ2 of the light emission spectrum of the blue light emission layer 131B, by interference between the fourth reflection interface S4B and the center OB of the light emission.

In one specific but non-limiting example, the optical distances L13, L23, L14, and L24 are configured to satisfy the following expressions [3], [4], [7], [8], [11], [12], [15], and [16].

$$2L13/\lambda13 + a3/(2\pi) = m3 + \tfrac{1}{2} \quad [3]$$

$$2L14/\lambda14 + a4/(2\pi) = m4 + \tfrac{1}{2} \quad [4]$$

$$\lambda1 - 150 < \lambda13 < \lambda1 + 150 \quad [7]$$

$$\lambda1 - 150 < \lambda14 < \lambda1 + 150 \quad [8]$$

$$2L23/\lambda23 + c3/(2\pi) = n3 \quad [11]$$

$$2L24/\lambda24 + c4/(2\pi) = n4 \quad [12]$$

$$\lambda2 - 150 < \lambda23 < \lambda2 + 150 \quad [15]$$

$$\lambda2 - 150 < \lambda24 < \lambda2 + 150 \quad [16]$$

where m3, m4, n3, and n4 are integral numbers,

λ1, λ13, λ14, λ2, λ23, and λ24 are in units of nm, a3 is a phase change generated in reflection of light of any wavelength from the third reflection interface S3R, the light being emitted from the red light emission layer 131R, a4 is a phase change generated in reflection of light of any wavelength from the fourth reflection interface S4R, the light being emitted from the red light emission layer 131R, c3 is a phase change generated in reflection of light of any wavelength from the third reflection interface S3B, the light being emitted from the blue light emission layer 131B, and c4 is a phase change generated in reflection of light of any wavelength from the fourth reflection interface S4B, the light being emitted from the blue light emission layer 131B.

In the forgoing, a3, c3, a4, and c4 may be obtained in a similar manner to those of a1 and c1.

In this way, although details are described later, it is possible to provide a difference between the red organic EL element 10R and the blue organic EL element 10B, in conditions of the reflection from the third reflection interfaces S3R and S3B, and the fourth reflection interfaces S4R and S4B. Hence, it is possible to adjust light emission states for each light emission element region, i.e., the red light emission element region 11R, the green light emission element region 11G, and the blue light emission element region 11B.

Figure 7A:
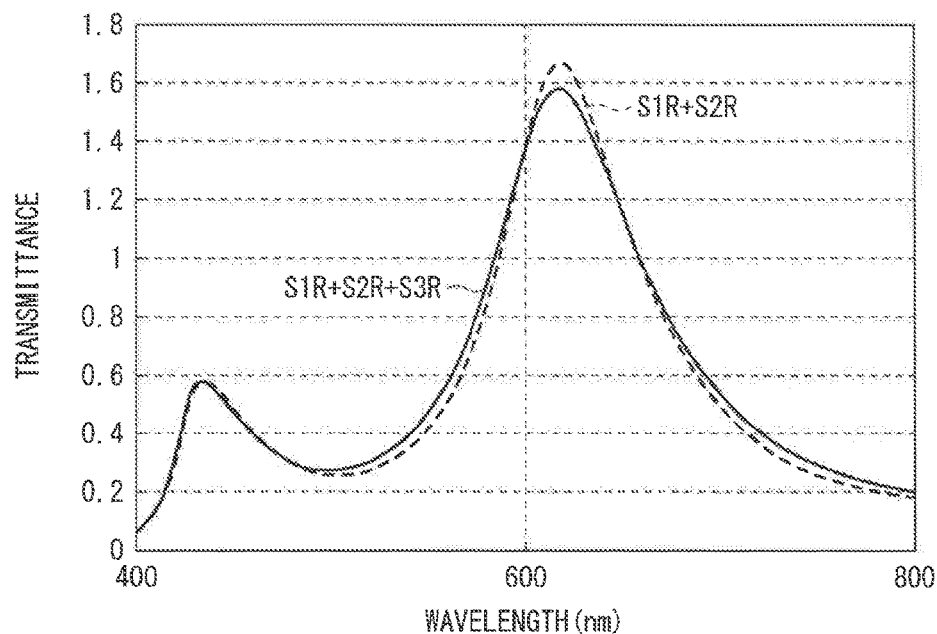
FIG. 7A illustrates transmittance of light reflected from the first reflection interface to a third reflection interface illustrated in FIG. 2A.
Figure 7B:
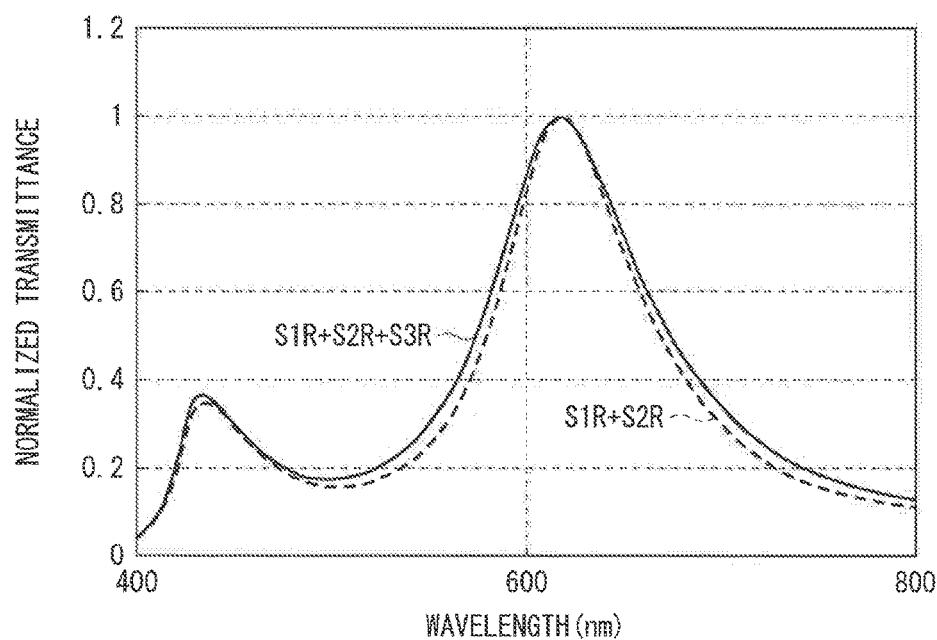
FIG. 7B illustrates normalized transmittance on the basis of the transmittance along a vertical axis illustrated in FIG. 7A.

FIGS. 7A and 7B illustrate transmittance of light reflected from the first refection interface S1R to the third reflection interface S3R of the red light emission element region 11R. In FIGS. 7A and 7B, the transmittance of the light reflected from the first reflection interface S1R to the third reflection interface S3R is denoted by a solid line. The transmittance of the light reflected from the first reflection interface S1R and the second reflection interface S2R is denoted by a broken line. In FIG. 7B, illustrated is normalized transmittance on the basis of the transmittance along a vertical axis in FIG. 7A, with a peak at a wavelength of 620 nm serving as 1. With the reflection from the third reflection interface S3R added, the light generated in the red light emission layer 131R is attenuated, providing a larger half value width of the spectrum.

Figure 8A:
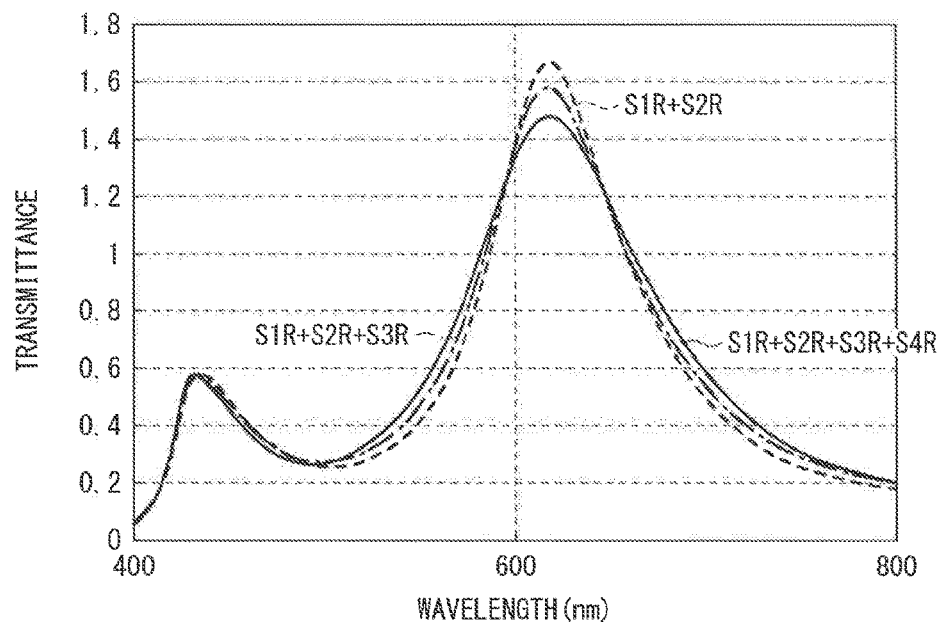
FIG. 8A illustrates transmittance of light reflected from the first reflection interface to a fourth reflection interface illustrated in FIG. 2A.
Figure 8B:
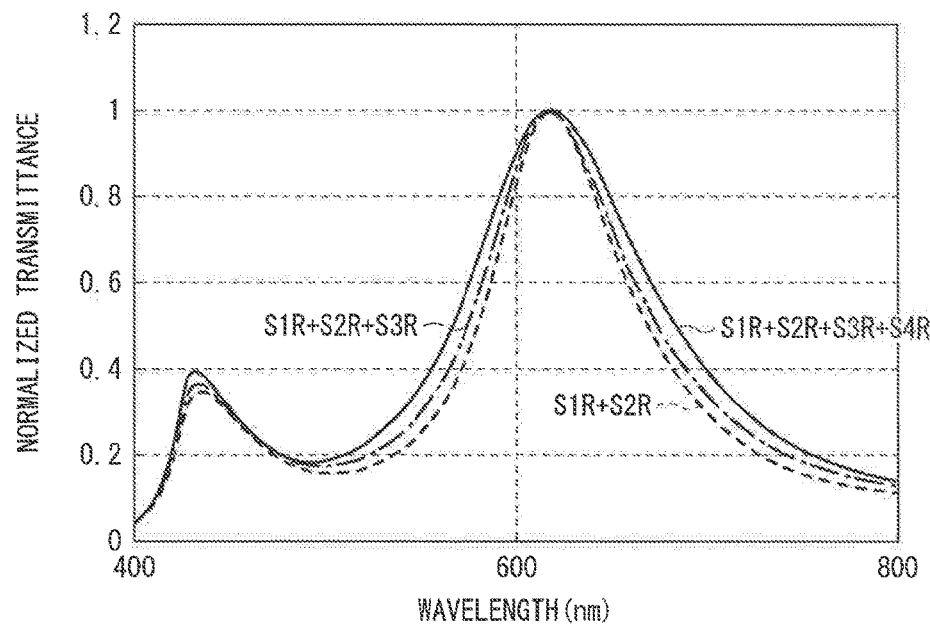
FIG. 8B illustrates normalized transmittance on the basis of the transmittance along a vertical axis illustrated in FIG. 8A.

FIGS. 8A and 8B illustrate transmittance of light reflected from the fourth reflection interface S4R, as added to FIGS. 7A and 7B. In FIGS. 8A and 8B, the transmittance of the light reflected from the first reflection interface S1R to the fourth reflection interface S4R is denoted by a solid line. The transmittance of the light reflected from the first reflection interface S1R to the third reflection interface S3R is denoted by a dash-dot line. The transmittance of the light reflected from the first reflection interface S1R and the second reflection interface S2R is denoted by a broken line. With the reflection from the fourth reflection interface S4R added, the light generated in the red light emission layer 131R is further attenuated, providing an even larger half value width of the spectrum. In this way, moderating the spectrum in the vicinity of a peak makes it possible to restrain abrupt changes in intensity and hues according to angle.

Figure 9A:
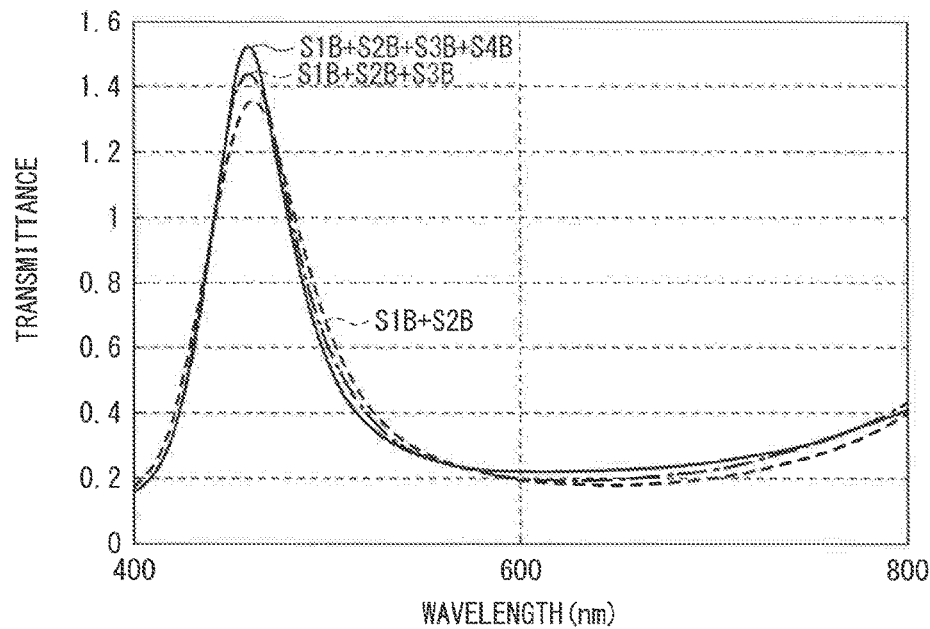
FIG. 9A illustrates transmittance of light reflected from a first reflection interface to a fourth reflection interface illustrated in FIG. 2B.
Figure 9B:
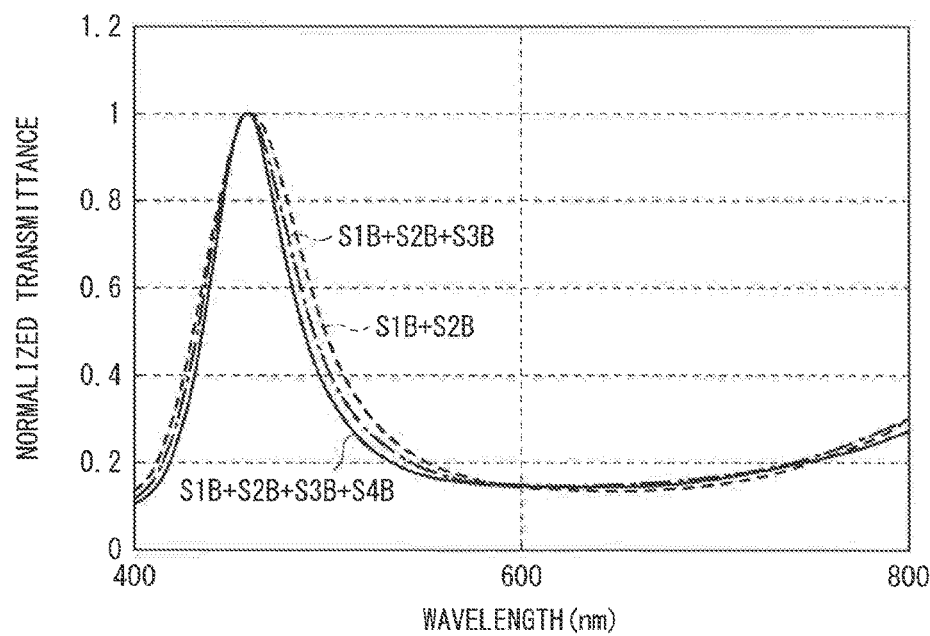
FIG. 9B illustrates normalized transmittance on the basis of the transmittance along a vertical axis illustrated in FIG. 9A.

FIGS. 9A and 9B illustrate transmittance of light reflected from the first reflection interface S1B to the fourth reflection interface S4B of the blue light emission element region 11B. In FIGS. 9A and 9B, the transmittance of the light reflected from the first reflection interface S1B to the fourth reflection interface S4B is denoted by a solid line. The transmittance of the light reflected from the first reflection interface S1B to the third reflection interface S3B is denoted by a dash-dot line. The transmittance of the light reflected from the first reflection interface S1B and the second reflection interface S2B is denoted by a broken line. In FIG. 9B, illustrated is normalized transmittance on the basis of the transmittance along a vertical axis in FIG. 9A, with a peak at a wavelength of 468 nm serving as 1. With the reflection from the fourth reflection interface S4B added, the light generated in the blue light emission layer 131B is reinforced, providing a larger peak. In this way, providing a steep peak makes it possible to enhance the efficiency of the light extraction. Moreover, it is possible to enhance a chromaticity point. In FIGS. 9A, and 9B, a position of a peak of the spectrum formed by the first reflection interface S1B and the second reflection interface S2B and a position of a peak of the spectrum formed by the third reflection interface S3B and the fourth reflection interface S4B are adjusted to coincide with each other, but they may be deviated. That way, it is possible to enlarge a wavelength range in which the effects of the cavity structure are produced, and to restrain steep changes in the intensity and the hues.

The green organic EL element 10G may include a first reflection interface to a fourth reflection interface that are constituted similarly to, for example, those of the blue organic EL element 10B. In one specific but non-limiting example, the first reflection interface to the fourth reflection interface are configured to allow reflection therefrom to cause reinforcement with respect to a center wavelength of a light emission spectrum of the green light emission layer 131G.

The light emission device 1 as described above may be manufactured by forming the first electrode 12, the organic layers, i.e., the red organic layer 13R, the green organic layer 13G, and the blue organic layer 13B, the semi-transparent reflection layers 14R, 14G, and 14B, the first transparent layers 15R, 15G, and 15B, the second transparent layers 16R, 16G, and 16B, and the third transparent layers 17R, 17G, and 17B in this order on the substrate 11. The red organic layer 13R, the green organic layer 13G, and the blue organic layer 13B may be formed by a vapor deposition method, or alternatively, they may be formed by printing. In other words, the red organic layer 13R, the green organic layer 13G, and the blue organic layer 13B may be printed layers. The first transparent layers 15R, 15G, and 15B may constitute a common layer, and be made of the same constituent material, with the same thickness, in the red light emission element region 11R, the green light emission element region 11G, and the blue light emission element region 11B. The second transparent layers 16R, 16G, and 16B may constitute a common layer, and be made of the same constituent material, with the same thickness, in the red light emission element region 11R, the green light emission element region 11G, and the blue light emission element region 11B. The third transparent layers 17R, 17G, and 17B may constitute a common layer, and be made of the same constituent material, with the same thickness, in the red light emission element region 11R, the green light emission element region 11G, and the blue light emission element region 11B.

[Workings and Effects]

In the light emission device 1 as described above, upon injection of a drive current into each of the light emission layers, i.e., the red light emission layer 131R of the red organic EL element 10R, the green light emission layer 131G of the green organic EL element 10G, and the blue light emission layer 131B of the blue organic EL element 10B, holes and electrons recombine in each of the light emission layers, to generate excitons, causing the light emission.

Figure 10:
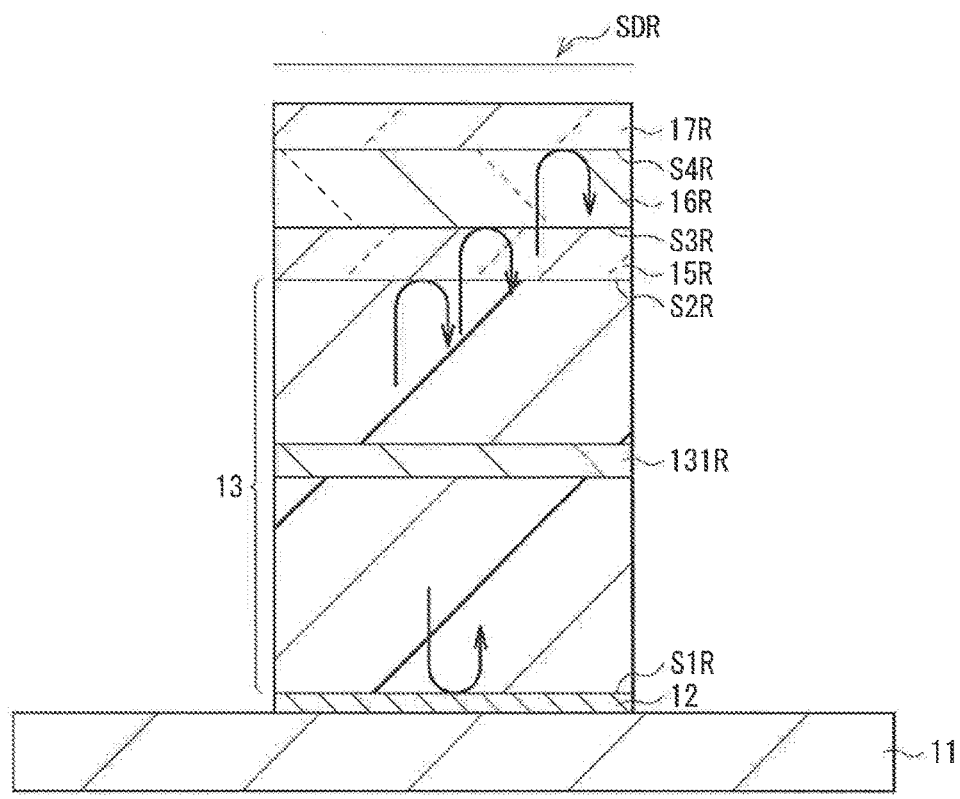
FIG. 10 is a cross-sectional view provided for description of operation of the light emission device illustrated in FIG. 1.

As illustrated in FIG. 10, the light emitted from each of the light emission layers is subjected to the multiple reflection between the first reflection interfaces, i.e., the first reflection interfaces S1R and S1B, and the fourth reflection interfaces, i.e., the fourth reflection interfaces S4R and S4B, to be extracted through the light extraction planes, i.e., the light extraction planes SDR and SDB. In the red organic EL element 10R, the red light LR is extracted through the light extraction plane SDR. In the green organic EL element 10G, the green light LG is extracted through the light extraction plane. In the blue organic EL element 10B, the blue light LB is extracted through the light extraction plane SDB. Additive color mixture of the red light LR, the green light LG, and the blue light LB provides expression of various colors.

However, in the light emission device having the cavity structure as mentioned above, although various structures have been proposed, it is difficult to enhance a light distribution characteristic.

For example, a proposal have been made for a method to enhance efficiency of light emission by setting a film thickness from a translucent electrode to a reflective electrode. For example, reference is made to International Publication No. WO01/039554. Moreover, an attempt have been made to control film thicknesses of organic layers to control balance of attenuation of three primary colors, i.e., red, green and blue, and to enhance a viewing angle characteristic of a white chromaticity point. For example, reference is made to Japanese Unexamined Patent Application Publication (JP-A) No. 2011-159433.

Such cavity structures serve as an interference filter having a small half value width, with respect to a spectrum of light to be extracted. Accordingly, with a light extraction plane being viewed obliquely, wavelengths of light may largely shift. This may cause lowered intensity of light emission according to viewing angle, resulting in high dependency on the viewing angle.

JP-A No. 2006-244713 proposes a structure for reduction in changes in hues according to the viewing angle. This structure may be applicable to a single color for successful reduction in the dependency of intensity on the viewing angle, but involves difficulties in application to a sufficiently wide wavelength range. A possible method to enlarge an applicable wavelength range may be to increase reflectance. In this case, however, the efficiency in the light extraction may be considerably lowered.

As mentioned above, although there are some possible methods to reduce the dependency on the angle by making an adjustment of positional relation, positions of light emission, and other features in the cavity structure, these method may result in difficulties in the adjustment. For example, there is a case where wavelength dispersion of refractive indexes occurs because of a spectrum of light emitted from each of the light emission layers. In the wavelength dispersion of the refractive indexes, because the refractive indexes of the constituent materials differ according to wavelength, there occur differences in the effects of the cavity structure between the red organic EL element, the green organic EL element, and the blue organic EL element. For example, in the red organic EL element, a peak of the red light to be extracted may become too steep. In the blue organic EL element, a peak of the blue light to be extracted may be moderated too much. Such a large difference in the effects of the cavity structure for each element region may contribute to the large dependency of the intensity and the hues on the angle, causing a lowered light distribution characteristic.

Meanwhile, in the light emission device 1, influences of the third reflection interface S3R and the fourth reflection interface S4R on the light generated in the red light emission layer 131R and influences of the third reflection interface S3B and the fourth reflection interface S4B on the light generated in the blue light emission layer 131B differ from each other. Specifically, the light generated in the red light emission layer 131R and the light generated in the blue light emission layer 131B act as follows.

The light generated in the red light emission layer 131R is attenuated by interference between the center OR of the light emission of the red light emission layer 131R and the third reflection interface S3R of the red light emission element region 11R, and between the center OR of the light emission of the red light emission layer 131R and the fourth reflection interface S4R of the red light emission element region 11R. Meanwhile, the light generated in the blue light emission layer 131B is reinforced by interference between the center OB of the light emission of the blue light emission layer 131B and the third reflection interface S3B of the blue light emission element region 11B, and between the center OB of the light emission of the blue light emission layer 131B and the fourth reflection interface S4B of the blue light emission element region 11B.

Thus, in the red light emission element region 11R, extracted through the light extraction plane SDR is the red light LR that is moderate in the vicinity of the peak, referring to FIGS. 8A and 8B. In the blue light emission element region 11B, extracted through the light extraction plane SDB is the blue light LB having a steep peak, referring to FIGS. 9A and 9B. Therefore, the difference between the effects of the cavity structure of the red light emission element region 11R and the effects of the cavity structure of the blue light emission element region 11B becomes small, leading to the small dependency of the intensity and the hues on the angle. Hence, it is possible to enhance the light distribution characteristic. Moreover, the light emission device 1 having the high light distribution characteristic is suitable for a display apparatus having high image quality, leading to higher productivity of the display apparatus.

Figure 11:
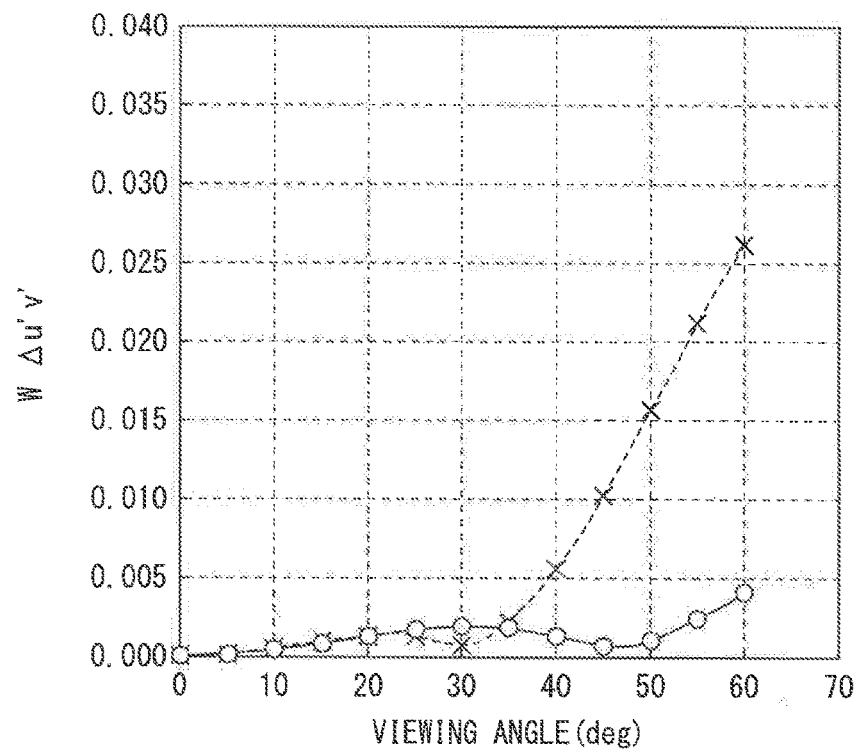
FIG. 11 illustrates one example of a change in chromaticity according to viewing angle, regarding the light emission device illustrated in FIG. 1.
Figure 12:
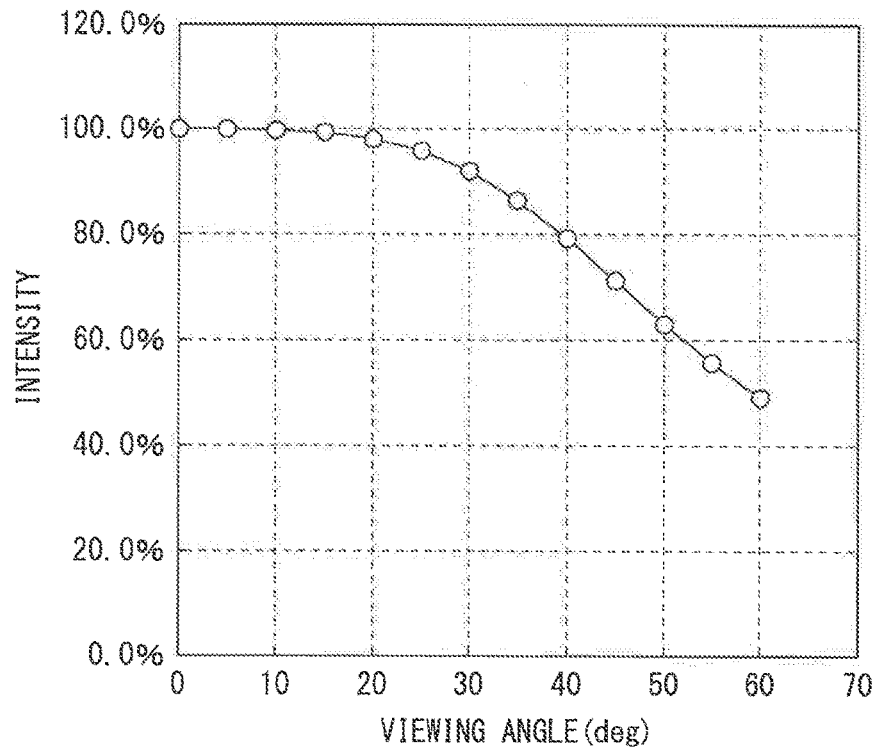
FIG. 12 illustrates one example of a change in intensity according to the viewing angle, regarding the light emission device illustrated in FIG. 1.

FIGS. 11 and 12 illustrate the viewing angle characteristics. FIG. 11 illustrates changes in chromaticity according to the viewing angle. FIG. 12 illustrates changes in intensity according to the viewing angle. The light emission device 1 is able to maintain Δuv of 0.015 or less (Δuv≤0.015) and intensity of 60% or more, even at the viewing angle of 45°. This leads to high light emission quality.

As described, in the light emission device 1 according to this embodiment, the third reflection interface S3R and the fourth reflection interface S4R of the red light emission element region 11R are so provided as to cause the attenuation of the light generated in the red light emission layer 131R. The third reflection interface S3B and the fourth reflection interface S4B of the blue light emission element region 11B are so provided as to cause the reinforcement of the light generated in the blue light emission layer 131B. Hence, it is possible to adjust the effects of the cavity structure for each element region, leading to enhancement in the light distribution characteristic.

Moreover, it is possible to obtain high light transmittance over a wide wavelength range, allowing for the enhancement in the efficiency of the light extraction. This also makes it possible to restrain power consumption.

It is to be noted that forming the third reflection interfaces S3R and S3B, and the fourth reflection interfaces S4R and S4B with the stack of the metal thin films each having the thickness of 5 nm or more makes it possible to obtain the high light transmittance over the wide wavelength range.

Furthermore, providing the semi-transparent reflection layers 14R, 14G, and 14B, to constitute the second reflection interfaces, e.g., the second reflection interfaces S2R and S2B, by the interfaces between the organic layers, e.g., the red organic layer 13R and the blue organic layer 13B, and the semi-transparent reflection layers 14R, 14G, and 14B makes it possible to enhance the amplification effects of the cavity structure, leading to the further enhancement in the efficiency of the light extraction.

In addition, the light emission device 1 may be suitable for a case where the organic layers, e.g., the red organic layer 13R and the blue organic layer 13B, are the printed layers. The organic layers easily have unevenness in thickness according to region, while they are subjected to, for example, a drying process. In other words, the organic layers easily have thickness distribution. In the light emission device 1, it is possible to adjust the difference in the effects of the cavity structure caused by the thickness distribution.

Described below are modification examples of this embodiment. In the following description, the same constituent parts as those in the forgoing embodiment are denoted by the same reference characters, and description thereof is omitted as appropriate.

Modification Example 1

Figure 13:
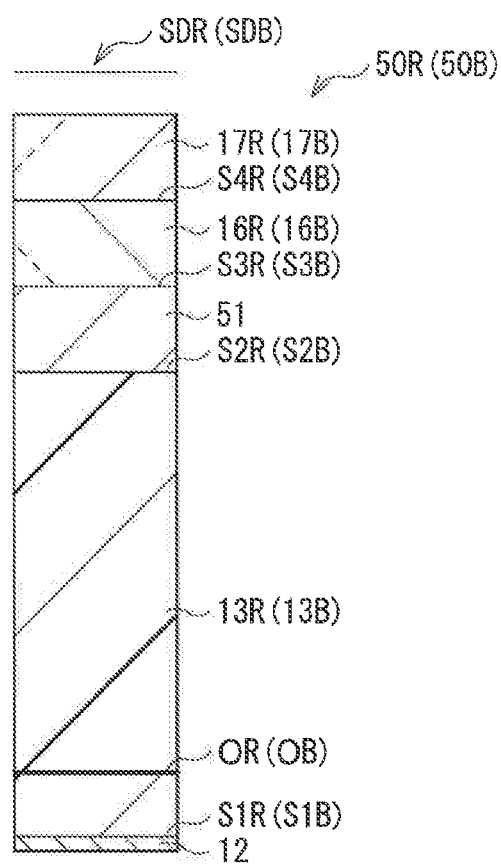
FIG. 13 is a cross-sectional view of a schematic configuration of a red organic EL element according to a modification example 1.

FIG. 13 schematically illustrates a cross-sectional configuration of a red organic EL element, e.g., a red organic EL element 50R, according to a modification example 1 of the forgoing embodiment. In the red organic EL element 50R, the second reflection interface S2R may be constituted by an interface between the red organic layer 13R and a metal layer 51. Otherwise, the red organic EL element 50R may have similar configurations to those of the red organic EL element 10R according to the forgoing embodiment, and have similar workings and effects as well.

For the metal layer 51, for example, magnesium (Mg), silver (Ag), or their alloys may be used. In one preferable but non-limiting example, a thickness of the metal layer 51 may be, for example, 5 nm or more. Forming the second reflection interface S2R with the metal layer 51 as described above makes it possible to suppress reflection of outside light. Description regarding this is given below.

Figure 14:
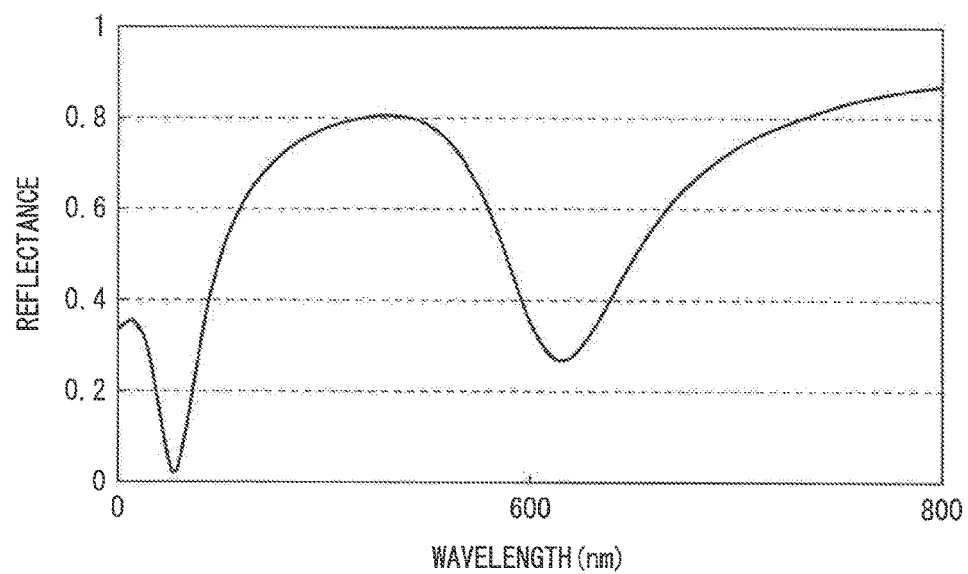
FIG. 14 illustrates spectral reflectance of the red organic EL element illustrated in FIG. 13.

FIG. 14 illustrates a spectral reflection characteristic of the red light emission element region 11R, with the metal layer 51 being provided. In one preferable but non-limiting example, a color filter, e.g., a color filter layer 74 in FIG. 21 described later, may be provided together with the metal layer 51. The color filter, in the red light emission element region 11R, may transmit the light of the red wavelength range, and absorb the light of the green wavelength range and the blue wavelength range. Thus, providing the metal layer 51 together with the color filter causes multiple reflection because of an extinction coefficient of a metal thin film, making it possible to suppress the reflection of the outside light. Hence, it is possible to simultaneously produce the amplification effects of the cavity structure and effects of suppressing the reflection of the outside light.

For example, the green organic EL element and the blue organic EL element, e.g., a blue organic EL element 50B, may also include the metal layer 51.

Modification Example 2

Figure 15:
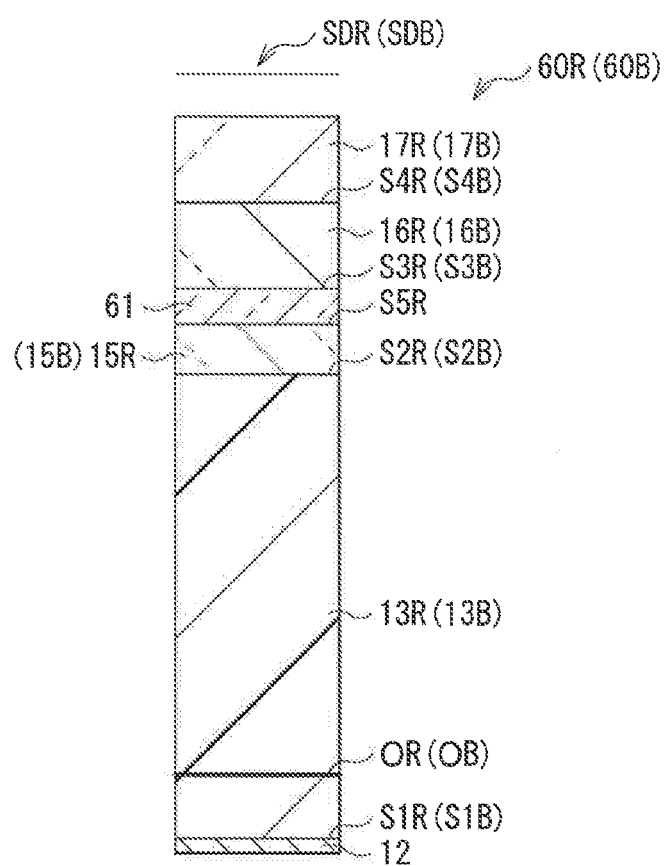
FIG. 15 is a cross-sectional view of a schematic configuration of a red organic EL element according to a modification example 2.

FIG. 15 schematically illustrates a cross-sectional configuration of a red organic EL element, e.g., a red organic EL element 60R, according to a modification example 2 of the forgoing embodiment. The red organic EL element 60R may include a fifth reflection interface, e.g., a fifth reflection interface S5R, in addition to the first reflection interface S1R to the fourth reflection interface S4R. Otherwise, the red organic EL element 60R may have similar configurations to those of the red organic EL element 10R according to the forgoing embodiment, and have similar workings and effects as well.

The fifth reflection interface S5R may be provided between, for example, the second reflection interface S2R and the third reflection interface S3R. The fifth reflection interface S5R may be constituted by, for example, an interface between the first transparent layer 15R and a fifth transparent layer 61, and be formed by a difference in refractive indexes between the constituent material of the first transparent layer 15R and a constituent material of the fifth transparent layer 61. The fifth transparent layer 61 may be provided, for example, between the first transparent layer 15R and the second transparent layer 16R.

Figure 16:
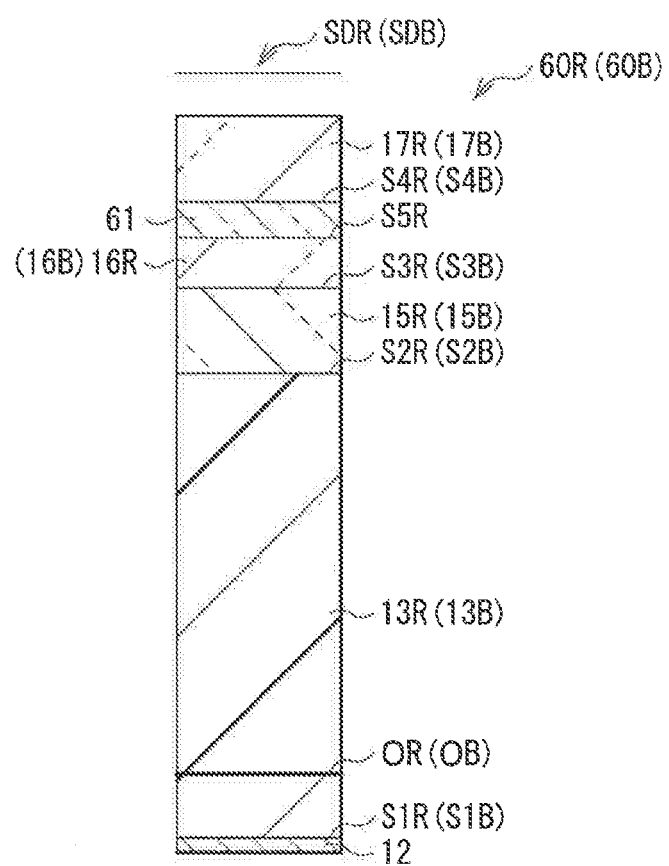
FIG. 16 is a cross-sectional view of another example (1) of the red organic EL element illustrated in FIG. 15.
Figure 17:
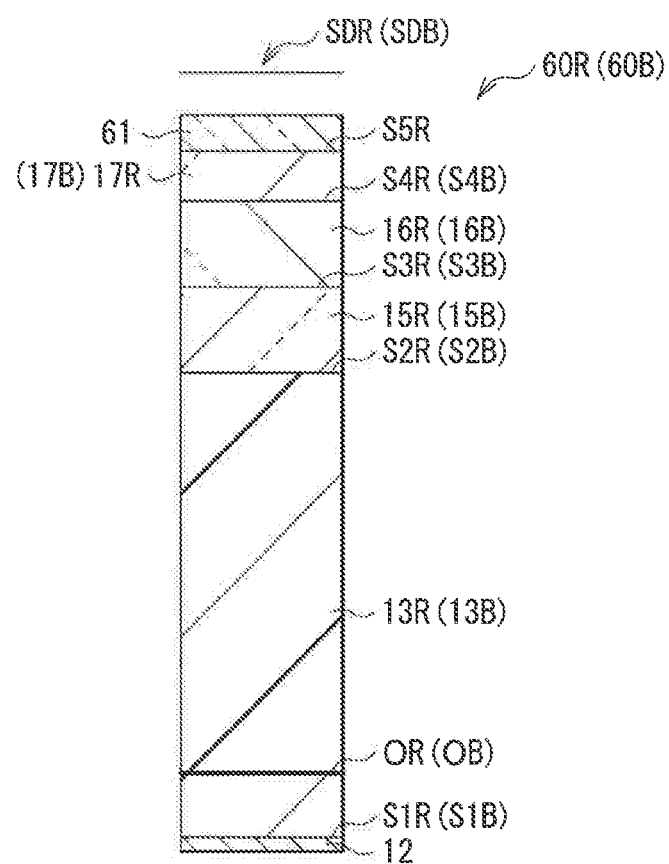
FIG. 17 is a cross-sectional view of another example (2) of the red organic EL element illustrated in FIG. 15.
Figure 18:
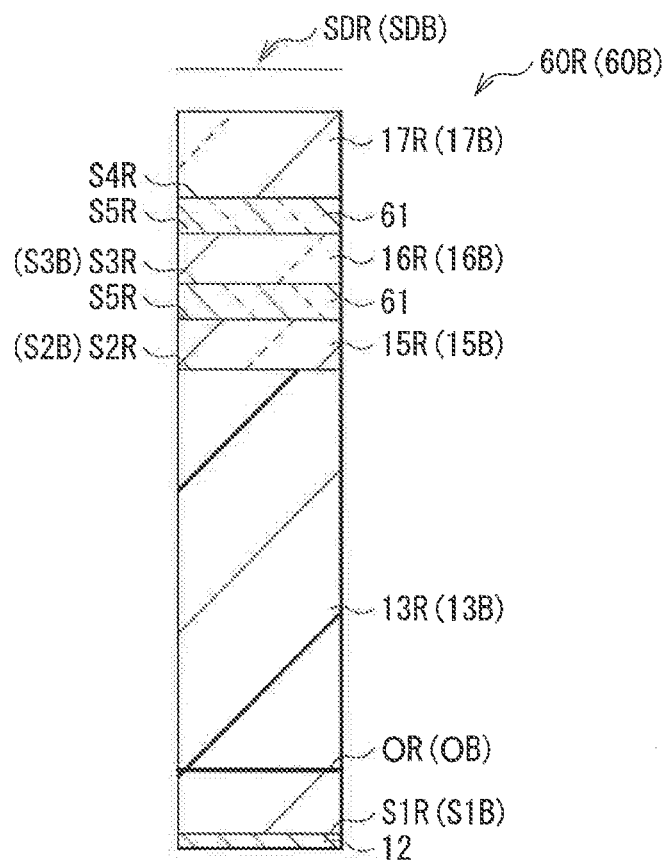
FIG. 18 is a cross-sectional view of another example (3) of the red organic EL element illustrated in FIG. 15.

FIGS. 16 to 18 illustrate other examples of the cross-sectional configuration of the red organic EL element 60R.

As illustrated in FIG. 16, the fifth reflection interface S5R may be provided between the third reflection interface S3R and the fourth reflection interface S4R. At this occasion, the fifth transparent layer 61 may be provided, for example, between the second transparent layer 16R and the third transparent layer 17R.

As illustrated in FIG. 17, the fifth reflection interface S5R may be provided between the fourth reflection interface S4R and the light extraction plane SDR. At this occasion, in one preferable but non-limiting example, the fifth reflection interface S5R may be located at an optical distance of 1200 nm or less from the second reflection interface S2R. This is because the effects of the cavity structure are not produced, with the distance from the second reflection interfaces S2R and S2B to the fourth reflection interface S4R and S4B being large. The fifth transparent layer 61 may be provided, for example, on the third transparent layer 17R.

As illustrated in FIG. 18, the fifth reflection interface S5R may be provided in a plurality. For example, the fifth reflection interfaces S5R may be provided between the second reflection interface S2R and the third reflection interface S3R, and between the third reflection interface S3R and the fourth reflection interface S4R. Alternatively, although illustration is omitted, the fifth reflection interfaces S5R may be provided between the second reflection interface S2R and the third reflection interface S3R, and between the fourth reflection interface S4R and the light extraction plane SDR, or in another alternative, the fifth reflection interfaces S5R may be provided between the third reflection interface S3R and the fourth reflection interface S4R, and the fourth reflection interface and the light extraction plane SDR. Alternatively, the three or more fifth reflection interfaces S5R may be provided.

The fifth reflection interface S5R may be configured to allow reflection therefrom to cause attenuation, or to cause reinforcement, with respect to the center wavelength $\lambda 1$ of the light emission spectrum of the red light emission layer 131R. With the plurality of the fifth reflection interfaces S5R being provided, all of them may be configured to allow reflection therefrom to cause the attenuation, or to cause the reinforcement, with respect to the center wavelength $\lambda 1$ of the light emission spectrum of the red light emission layer 131R. With the plurality of the fifth reflection interfaces S5R being provided, some of them may be configured to allow reflection therefrom to cause the attenuation, while others may be configured to allow reflection therefrom to cause the reinforcement, with respect to the center wavelength $\lambda 1$ of the light emission spectrum of the red light emission layer 131R.

For example, the green organic EL element and the blue organic EL element, e.g., the blue organic EL element 50B, may also include the fifth reflection interface.

Providing the fifth reflection interface S5R makes it possible to adjust the effects of the cavity structure more finely. Two or more of the fifth reflection interfaces S5R illustrated in FIGS. 15 to 18 may be combined.

Modification Example 3

Figure 19:
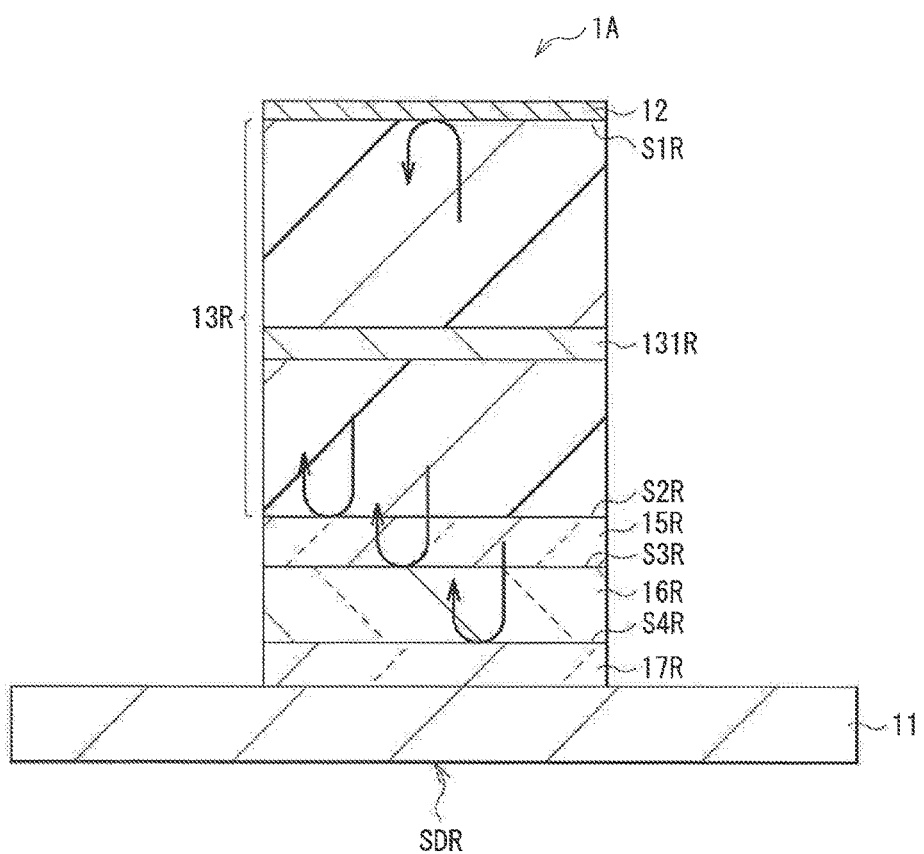
FIG. 19 is a cross-sectional view of a schematic configuration of a light emission device according to a modification example 3.

FIG. 19 schematically illustrates a cross-sectional configuration of a light emission device, e.g., a light emission device 1A, according to a modification example 3 of the forgoing embodiment. The light emission device 1A may be a light emission device of a bottom emission type, and include the third transparent layers 17R and 17B, the second transparent layers 16R and 16B, the organic layers, e.g., the red organic layer 13R and the blue organic layer 13B, and the first electrode 12 in this order on the substrate 11. In other words, the light extraction plane SDR, the fourth reflection interface S4R, the third reflection interface S3R, the second reflection interface S2R, and the first reflection interface S1R may be provided in this order from the side on which the substrate 11 is disposed. Otherwise, the light emission device 1A may have similar configurations to those of the light emission device 1 according to the forgoing embodiment, and have similar workings and effects as well.

Application Example 1

The light emission devices 1 and 1A as described in the forgoing example embodiments may be applied to, for example, a display apparatus, e.g., a display apparatus 2 in FIG. 20 described later. Applying the light emission devices 1 and 1A having the high light distribution characteristic to the display apparatus leads to a diminution of the dependency of the intensity and the hues on the angle, allowing for high image quality.

Figure 20:
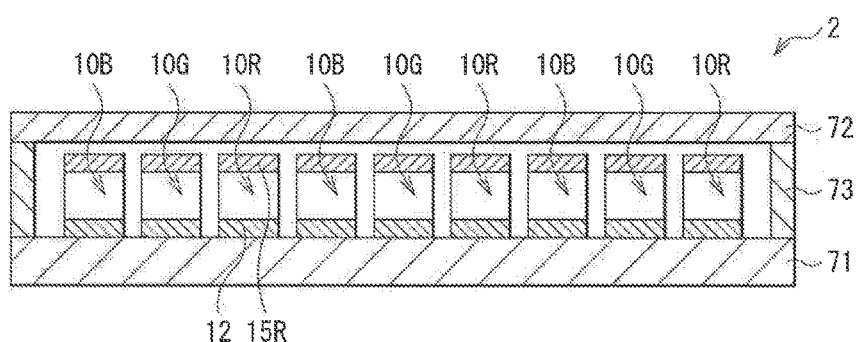
FIG. 20 is a cross-sectional view of a configuration in outline of a display apparatus to which the light emission devices illustrated in FIG. 1 and other figures are applied.

FIG. 20 illustrates a schematic cross-sectional configuration of the display apparatus, e.g., the display apparatus 2, to which the light emission devices 1 and 1A are applied. The display apparatus 2 may be an active-matrix display apparatus, and include a driver substrate 71. The display apparatus 2 may include a sealing substrate 72 that is confronted with the driver substrate 71. The display apparatus 2 may further include the red organic EL element 10R, the green organic EL element 10G, and the blue organic EL element 10B between the driver substrate 71 and the sealing substrate 72. Instead of the red organic EL element 10R, the display apparatus 2 may include the red organic EL element 50R or 60R. Instead of the blue organic EL element 10B, the display apparatus 2 may include the blue organic EL element 50B or 60B. Outer peripheries of the driver substrate 71 and the sealing substrate 72 may be sealed by a sealing agent 73. In the display apparatus 2, an image may be displayed, for example, on side on which the sealing substrate 72 is disposed. The display apparatus 2 may provide either monochrome display or color display.

The driver substrate 71 may include a thin film transistor as a drive element for each pixel. The driver substrate 71 may include not only the thin film transistor but also scan lines, current supply lines, and data lines that drive each thin film transistor. The thin film transistor of each pixel may be supplied with a corresponding display signal for each display pixel. The pixel may be driven in accordance with the display signal, and the image may be displayed.

Figure 21:
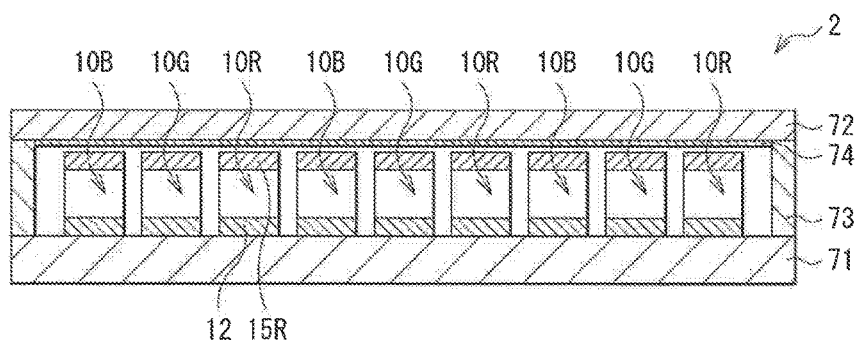
FIG. 21 is a cross-sectional view of another example of the display apparatus illustrated in FIG. 20.

As illustrated in FIG. 21, the display apparatus 2 may include the color filter layer 74. The color filter layer 74 may be provided, for example, on one surface of the sealing substrate 72, e.g., a surface opposite to the driver substrate 71. In the color filter layer 74, color filters may be provided for respective pixels. The color filters may correspond to respective colors, i.e., red, green, and blue.

Figure 22:
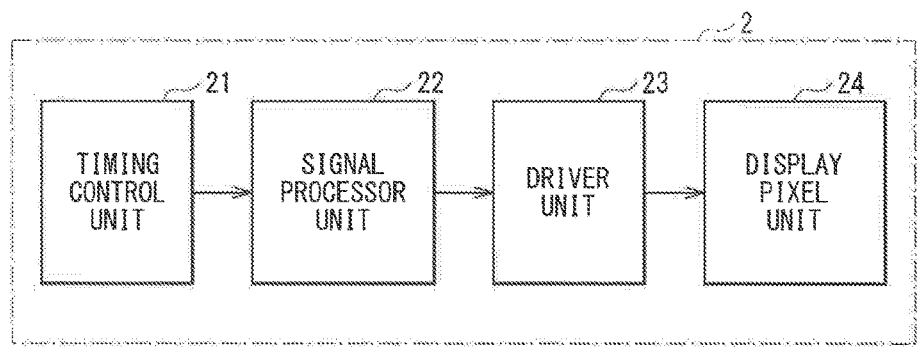
FIG. 22 is a block diagram that illustrates a configuration of the display apparatus illustrated in FIG. 20.

FIG. 22 illustrates a functional block configuration of the display apparatus 2.

The display apparatus 2 may display a picture on the basis of a picture signal inputted from outside or a picture signal generated inside. The display apparatus 2 may be applied to not only the organic EL display as mentioned above but also, for example, a liquid crystal display. The display apparatus 2 may include, for example, a timing control unit 21, a signal processor unit 22, a driver unit 23, and a display pixel unit 24.

The timing control unit 21 may include a timing generator that generates various kinds of timing signals or control signals. On the basis of these timing signals of various kinds, the timing control unit 21 may perform a drive control of the signal processor unit 22 and other units. The signal processor unit 22 may perform, for example, a predetermined correction on a digital picture signal inputted from outside, and output a signal thus obtained, to the driver unit 23. The driver unit 23 may include, for example, a scan line driver circuit and a signal line driver circuit, and drive each pixel of the display pixel unit 24 through various kinds of control lines. The display pixel unit 24 may include the organic EL elements, e.g., the red organic EL element 10R, the green organic EL element 10G, and the blue organic EL element 10B, and a pixel circuit that drives the organic EL elements on the pixel basis. Out of these, for example, the driver unit 23 may be constituted by the driver substrate 71.

[Example of Electronic Apparatus]

Figure 23:
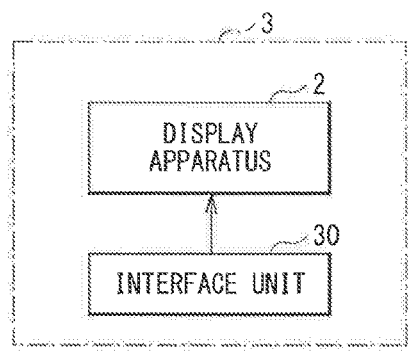
FIG. 23 is a block diagram that illustrates a configuration of an electronic apparatus to which the display apparatus illustrated in FIG. 22 or other devices are applied.

The display apparatus 2 may be used in various types of electronic apparatuses. FIG. 23 illustrates a functional block configuration of an electronic apparatus 3. Non-limiting examples of the electronic apparatus 3 may include television devices, personal computers (PCs), smartphones, tablet PCs, mobile phones, digital still cameras, and digital camcorders.

The electronic apparatus 3 may include, for example, the display apparatus 2 as mentioned above, and an interface unit 30. The interface unit 30 may be an input unit to which, for example, various kinds of signals and power are inputted from outside. The interface unit 30 may further include, for example, a user interface such as a touch panel, a keyboard, and an operation button.

Application Example 2

The light emission devices 1 and 1A as described in the forgoing example embodiments may be applied to, for example, an illumination apparatus, e.g., an illumination unit 410 in FIG. 24 described later. The light emission devices 1 and 1A may be applicable to light sources of diverse fields, e.g., desktop or floor-mounted illumination apparatuses or indoor illumination apparatuses.

Figure 24:
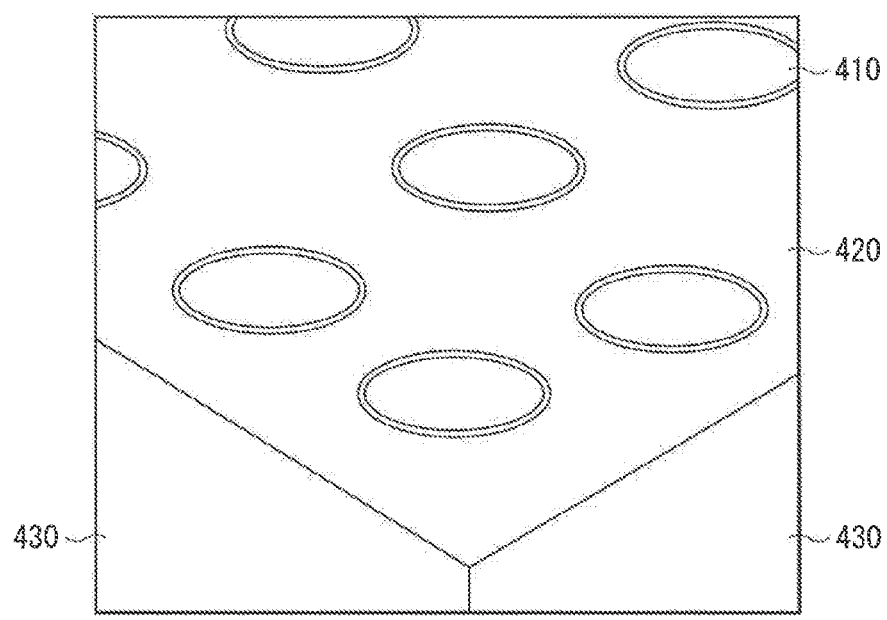
FIG. 24 illustrates, in a perspective manner, one example of an external appearance of an illumination apparatus to which the light emission devices illustrated in FIG. 1 and other figures are applied.

FIG. 24 illustrates an external appearance of the indoor illumination apparatus to which the light emission devices 1 and 1A are applied. The illumination apparatus may include, for example, the illumination units 410 each including the organic EL elements, e.g., the red organic EL element 10R, the green organic EL element 10G, and the blue organic EL element 10B. The illumination units 410 may be disposed on a ceiling 420 of a building, as many as appropriate, at appropriate intervals. It is to be noted that the illumination units 410 may be installed at any locations, for example, on a wall 430 or an undepicted floor, as well as the ceiling 420, according to application.

In these illumination apparatuses, illumination may be performed by light from the light emission devices 1 and 1A having the high light distribution characteristic. Hence, it is possible to provide illumination with optimal color rendering properties.

Although description of the disclosure has been made by giving the embodiment and the modification examples as mentioned above, the contents of the disclosure are not limited to the above-mentioned example embodiments and may be modified in a variety of ways. For example, the numerical values, the structures, the shapes, the materials, and the fabrication methods as described in the forgoing example embodiments are given as examples. Different values, structures, shapes, materials, or fabrication methods may be adopted.

Moreover, in the forgoing example embodiments, described is the case where the green organic EL element 10G may have the similar cavity structure to that of the blue organic EL element 10B. However, the green organic EL element 10G may have the similar cavity structure to that of the red organic EL element 10R.

It is to be noted that effects described in the specification are merely exemplified and not limited thereto, and effects of the disclosure may be other effects or may further include other effects.

It is possible to achieve at least the following configurations from the above-described example embodiments of the disclosure.

(1) A light emission device, including:

a first light emission element region and a second light emission element region;

a first reflection interface provided in the first light emission element region and the second light emission element region;

a light extraction plane provided in confronted relation to the first reflection interface;

a first light emission layer provided between the first reflection interface and the light extraction plane of the first light emission element region;

a second light emission layer provided between the first reflection interface and the light extraction plane of the second light emission element region;

a second reflection interface provided between the first light emission layer and the light extraction plane, and between the second light emission layer and the light extraction plane, the second reflection interface being configured to allow reflection from the second reflection interface to cause reinforcement with respect to center wavelengths of light emission spectra of the first light emission layer and the second light emission layer;

a third reflection interface provided between the second reflection interface and the light extraction plane, the third reflection interface being configured to allow reflection from the third reflection interface to cause attenuation with respect to the center wavelength of the light emission spectrum of the first light emission layer, and to cause reinforcement with respect to the center wavelength of the light emission spectrum of the second light emission layer; and a fourth reflection interface provided between the third reflection interface and the light extraction plane, the fourth reflection interface being configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

(2) The light emission device according to (1), in which the first reflection interface is configured to allow reflection from the first reflection interface to cause reinforcement with respect to the center wavelengths of the light emission spectra of the first light emission layer and the second light emission layer.

(3) The light emission device according to (2), in which L11, L12, L13, and L14 satisfy the following expressions [1] to [8], with L11 being an optical distance from the first reflection interface to a center of light emission of the first light emission layer, with L12 being an optical distance from the second reflection interface to the center of the light emission of the first light emission layer, with L13 being an optical distance from the third reflection interface to the center of the light emission of the first light emission layer, with L14 being an optical distance from the fourth reflection interface to the center of the light emission of the first light emission layer, and with λ1 being the center wavelength of the light emission spectrum of the first light emission layer, $$2L11/\lambda11 + a1/(2\pi) = m1 \, (m1 \geq 0) \quad [1]$$

$$2L12/\lambda12 + a2/(2\pi) = m2 \quad [2]$$

$$2L13/\lambda13 + a3/(2\pi) = m3 + \tfrac{1}{2} \quad [3]$$

$$2L14/\lambda14 + a4/(2\pi) = m4 + \tfrac{1}{2} \quad [4]$$

$$\lambda1 - 150 < \lambda11 < \lambda1 + 80 \quad [5]$$

$$\lambda 1-80<\lambda 12<\lambda 1+80 \quad [6]$$

$$\lambda 1-150<\lambda 13<\lambda 1+150 \quad [7]$$

$$\lambda 1-150<\lambda 14<\lambda 1+150 \quad [8]$$

where m1, m2, m3, and m4 are integral numbers, $\lambda 1$, $\lambda 11$, $\lambda 12$, $\lambda 13$, and $\lambda 14$ are in units of nm, a1 is a phase change generated in reflection of light of any wavelength from the first reflection interface, the light being emitted from the first light emission layer, a2 is a phase change generated in reflection of the light of any wavelength from the second reflection interface, the light being emitted from the first light emission layer, a3 is a phase change generated in reflection of the light of any wavelength from the third reflection interface, the light being emitted from the first light emission layer, and a4 is a phase change generated in reflection of the light of any wavelength from the fourth reflection interface, the light being emitted from the first light emission layer.

(4) The light emission device according to (3), in which m1 equals to 0 (m1=0), and m2 equals to 1 (m2=1).

(5) The light emission device according to any one of (2) to (4), in which

L21, L22, L23, and L24 satisfy the following expressions [9] to [16], with L21 being an optical distance from the first reflection interface to a center of light emission of the second light emission layer, with L22 being an optical distance from the second reflection interface to the center of the light emission of the second light emission layer, with L23 being an optical distance from the third reflection interface to the center of the light emission of the second light emission layer, with L24 being an optical distance from the fourth reflection interface to the center of the light emission of the second light emission layer, and with $\lambda 2$ being the center wavelength of the light emission spectrum of the second light emission layer, $$2L21/\lambda 21+c1/(2\pi)=n1(n1\geq 0) \quad [9]$$

$$2L22/\lambda 22+c2/(2\pi)=n2 \quad [10]$$

$$2L23/\lambda 23+c3/(2\pi)=n3 \quad [11]$$

$$2L24/\lambda 24+c4/(2\pi)=n4 \quad [12]$$

$$\lambda 2-150<\lambda 21<\lambda 2+80 \quad [13]$$

$$\lambda 2-80<\lambda 22<\lambda 2+80 \quad [14]$$

$$\lambda 2-150<\lambda 23<\lambda 2+150 \quad [15]$$

$$\lambda 2-150<\lambda 24<\lambda 2+150 \quad [16]$$

where n1, n2, n3, and n4 are integral numbers, $\lambda 2$, $\lambda 21$, $\lambda 22$, $\lambda 23$, and $\lambda 24$ are in units of nm, c1 is a phase change generated in reflection of light of any wavelength from the first reflection interface, the light being emitted from the second light emission layer, c2 is a phase change generated in reflection of the light of any wavelength from the second reflection interface, the light being emitted from the second light emission layer, c3 is a phase change generated in reflection of the light of any wavelength from the third reflection interface, the light being emitted from the second light emission layer, and c4 is a phase change generated in reflection of the light of any wavelength from the fourth reflection interface, the light being emitted from the second light emission layer.

(6) The light emission device according to (5), in which n1 equals to 0 (n1=0), and n2 equals to 1 (n2=1).

(7) The light emission device according to any one of (1) to (6), further including a fifth reflection interface between the second reflection interface and the third reflection interface, between the third reflection interface and the fourth reflection interface, or between the fourth reflection interface and the light extraction plane, or any combination thereof.

(8) The light emission device according to any one of (1) to (7), further including a first electrode and a second electrode that are provided in the first light emission element region and the second light emission element region, in confronted relation to each other, with the first light emission layer and the second light emission layer in between, in which the first electrode is confronted with the first light emission layer and the second light emission layer, with the first reflection interface in between, and the second electrode is provided between the first light emission layer and the second light emission layer, and the light extraction plane.

(9) The light emission device according to (8), further including a substrate, in which the first electrode, the first light emission layer and the second light emission layer, and the second electrode are located in order of closeness to the substrate.

(10) The light emission device according to (8), further including a substrate, in which the second electrode, the first light emission layer and the second light emission layer, and the first electrode are located in order of closeness to the substrate.

(11) The light emission device according to any one of (1) to (10), further including:

a first organic layer including the first light emission layer; and a second organic layer including the second light emission layer.

(12) The light emission device according to (11), in which the first organic layer and the second organic layer are printed layers.

(13) The light emission device according to any one of (1) to (12), further including a semi-transparent reflection layer or a transparent reflection layer that is provided in the first light emission element region and the second light emission element region, in which the second reflection interface is formed by the semi-transparent reflection layer or the transparent reflection layer.

(14) The light emission device according to (11) or (12), further including a metal layer and a color filter that are provided in the first light emission element region and the second light emission element region, in which the second reflection interface is an interface between each of the first organic layer and the second organic layer, and the metal layer.

(15) The light emission device according to (14), in which a thickness of the metal layer is equal to or larger than 5 nm.

(16) A display apparatus, including a light emission device and drive elements that drive the light emission device on a pixel basis, the light emission device including:

a first light emission element region and a second light emission element region;

a first reflection interface provided in the first light emission element region and the second light emission element region;

a light extraction plane provided in confronted relation to the first reflection interface;
a first light emission layer provided between the first reflection interface and the light extraction plane of the first light emission element region;
a second light emission layer provided between the first reflection interface and the light extraction plane of the second light emission element region;
a second reflection interface provided between the first light emission layer and the light extraction plane, and between the second light emission layer and the light extraction plane, the second reflection interface being configured to allow reflection from the second reflection interface to cause reinforcement with respect to center wavelengths of light emission spectra of the first light emission layer and the second light emission layer;
a third reflection interface provided between the second reflection interface and the light extraction plane, the third reflection interface being configured to allow reflection from the third reflection interface to cause attenuation with respect to the center wavelength of the light emission spectrum of the first light emission layer, and to cause reinforcement with respect to the center wavelength of the light emission spectrum of the second light emission layer; and
a fourth reflection interface provided between the third reflection interface and the light extraction plane, the fourth reflection interface being configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

(17) An illumination apparatus, including a light emission device,
the light emission device including:
a first light emission element region and a second light emission element region;
a first reflection interface provided in the first light emission element region and the second light emission element region;
a light extraction plane provided in confronted relation to the first reflection interface;
a first light emission layer provided between the first reflection interface and the light extraction plane of the first light emission element region;
a second light emission layer provided between the first reflection interface and the light extraction plane of the second light emission element region;
a second reflection interface provided between the first light emission layer and the light extraction plane, and between the second light emission layer and the light extraction plane, the second reflection interface being configured to allow reflection from the second reflection interface to cause reinforcement with respect to center wavelengths of light emission spectra of the first light emission layer and the second light emission layer;
a third reflection interface provided between the second reflection interface and the light extraction plane, the third reflection interface being configured to allow reflection from the third reflection interface to cause attenuation with respect to the center wavelength of the light emission spectrum of the first light emission layer, and to cause reinforcement with respect to the center wavelength of the light emission spectrum of the second light emission layer; and
a fourth reflection interface provided between the third reflection interface and the light extraction plane, the fourth reflection interface being configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "about" as used herein can allow for a degree of variability in a value or range. Moreover, no element or component in this disclosure is intended to be dedicated to the public regardless of whether the element or component is explicitly recited in the following claims.

What is claimed is:
1. A light emission device, comprising:
a first light emission element region and a second light emission element region;
a first reflection interface provided in the first light emission element region and the second light emission element region;
a light extraction plane provided in confronted relation to the first reflection interface;
a first light emission layer provided between the first reflection interface and the light extraction plane of the first light emission element region;
a second light emission layer provided between the first reflection interface and the light extraction plane of the second light emission element region;
a second reflection interface provided between the first light emission layer and the light extraction plane, and between the second light emission layer and the light extraction plane, the second reflection interface being configured to allow reflection from the second reflection interface to cause reinforcement with respect to center wavelengths of light emission spectra of the first light emission layer and the second light emission layer;
a third reflection interface provided between the second reflection interface and the light extraction plane, the third reflection interface being configured to allow reflection from the third reflection interface to cause attenuation with respect to the center wavelength of the light emission spectrum of the first light emission layer, and to cause reinforcement with respect to the center wavelength of the light emission spectrum of the second light emission layer; and
a fourth reflection interface provided between the third reflection interface and the light extraction plane, the fourth reflection interface being configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

2. The light emission device according to claim 1, wherein the first reflection interface is configured to allow reflection from the first reflection interface to cause reinforcement with respect to the center wavelengths of the light emission spectra of the first light emission layer and the second light emission layer.

3. The light emission device according to claim 2, wherein L11, L12, L13, and L14 satisfy the following expressions [1] to [8], with L11 being an optical distance from the first reflection interface to a center of light emission of the first light emission layer, with L12 being an optical distance from the second reflection interface to the center of the light emission of the first light emission layer, with L13 being an optical distance from the third reflection interface to the center of the light emission of the first light emission layer, with L14 being an optical distance from the fourth reflection interface to the center of the light emission of the first light emission layer, and with $\lambda 1$ being the center wavelength of the light emission spectrum of the first light emission layer, $$2L11/\lambda 11 + a1/(2\pi) = m1(m1 \geq 0) \quad [1]$$

$$2L12/\lambda 12 + a2/(2\pi) = m2 \quad [2]$$

$$2L13/\lambda 13 + a3/(2\pi) = m3 + \tfrac{1}{2} \quad [3]$$

$$2L14/\lambda 14 + a4/(2\pi) = m4 + \tfrac{1}{2} \quad [4]$$

$$\lambda 1 - 150 < \lambda 11 < \lambda 1 + 80 \quad [5]$$

$$\lambda 1 - 80 < \lambda 12 < \lambda 1 + 80 \quad [6]$$

$$\lambda 1 - 150 < \lambda 13 < \lambda 1 + 150 \quad [7]$$

$$\lambda 1 - 150 < \lambda 14 < \lambda 1 + 150 \quad [8]$$

where m1, m2, m3, and m4 are integral numbers,
$\lambda 1$, $\lambda 11$, $\lambda 12$, $\lambda 13$, and $\lambda 14$ are in units of nm,
a1 is a phase change generated in reflection of light of any wavelength from the first reflection interface, the light being emitted from the first light emission layer,
a2 is a phase change generated in reflection of the light of any wavelength from the second reflection interface, the light being emitted from the first light emission layer,
a3 is a phase change generated in reflection of the light of any wavelength from the third reflection interface, the light being emitted from the first light emission layer, and
a4 is a phase change generated in reflection of the light of any wavelength from the fourth reflection interface, the light being emitted from the first light emission layer.

4. The light emission device according to claim 3, wherein m1 equals to 0 (m1=0), and m2 equals to 1 (m2=1).

5. The light emission device according to claim 2, wherein L21, L22, L23, and L24 satisfy the following expressions [9] to [16], with L21 being an optical distance from the first reflection interface to a center of light emission of the second light emission layer, with L22 being an optical distance from the second reflection interface to the center of the light emission of the second light emission layer, with L23 being an optical distance from the third reflection interface to the center of the light emission of the second light emission layer, with L24 being an optical distance from the fourth reflection interface to the center of the light emission of the second light emission layer, and with $\lambda 2$ being the center wavelength of the light emission spectrum of the second light emission layer, $$2L21/\lambda 21 + c1/(2\pi) = n1(n1 \geq 0) \quad [9]$$

$$2L22/\lambda 22 + c2/(2\pi) = n2 \quad [10]$$

$$2L23/\lambda 23 + c3/(2\pi) = n3 \quad [11]$$

$$2L24/\lambda 24 + c4/(2\pi) = n4 \quad [12]$$

$$\lambda 2 - 150 < \lambda 21 < \lambda 2 + 80 \quad [13]$$

$$\lambda 2 - 80 < \lambda 22 < \lambda 2 + 80 \quad [14]$$

$$\lambda 2 - 150 < \lambda 23 < \lambda 2 + 150 \quad [15]$$

$$\lambda 2 - 150 < \lambda 24 < \lambda 2 + 150 \quad [16]$$

where n1, n2, n3, and n4 are integral numbers,
$\lambda 2$, $\lambda 21$, $\lambda 22$, $\lambda 23$, and $\lambda 24$ are in units of nm,
c1 is a phase change generated in reflection of light of any wavelength from the first reflection interface, the light being emitted from the second light emission layer,
c2 is a phase change generated in reflection of the light of any wavelength from the second reflection interface, the light being emitted from the second light emission layer,
c3 is a phase change generated in reflection of the light of any wavelength from the third reflection interface, the light being emitted from the second light emission layer, and
c4 is a phase change generated in reflection of the light of any wavelength from the fourth reflection interface, the light being emitted from the second light emission layer.

6. The light emission device according to claim 5, wherein n1 equals to 0 (n1=0), and n2 equals to 1 (n2=1).

7. The light emission device according to claim 1, further comprising a fifth reflection interface between the second reflection interface and the third reflection interface, between the third reflection interface and the fourth reflection interface, or between the fourth reflection interface and the light extraction plane, or any combination thereof.

8. The light emission device according to claim 1, further comprising a first electrode and a second electrode that are provided in the first light emission element region and the second light emission element region, in confronted relation to each other, with the first light emission layer and the second light emission layer in between, wherein
the first electrode is confronted with the first light emission layer and the second light emission layer, with the first reflection interface in between, and
the second electrode is provided between the first light emission layer and the second light emission layer, and the light extraction plane.

9. The light emission device according to claim 8, further comprising a substrate, wherein
the first electrode, the first light emission layer and the second light emission layer, and the second electrode are located in order of closeness to the substrate.

10. The light emission device according to claim 8, further comprising a substrate, wherein the second electrode, the first light emission layer and the second light emission layer, and the first electrode are located in order of closeness to the substrate.

11. The light emission device according to claim 1, further comprising:
a first organic layer including the first light emission layer; and
a second organic layer including the second light emission layer.

12. The light emission device according to claim 11, wherein
the first organic layer and the second organic layer are printed layers.

13. The light emission device according to claim 11, further comprising a metal layer and a color filter that are provided in the first light emission element region and the second light emission element region, wherein
the second reflection interface is an interface between each of the first organic layer and the second organic layer, and the metal layer.

14. The light emission device according to claim 13, wherein
a thickness of the metal layer is equal to or larger than 5 nm.

15. The light emission device according to claim 1, further comprising a semi-transparent reflection layer or a transparent reflection layer that is provided in the first light emission element region and the second light emission element region, wherein
the second reflection interface is formed by the semi-transparent reflection layer or the transparent reflection layer.

16. A display apparatus, comprising a light emission device and drive elements that drive the light emission device on a pixel basis,
the light emission device including:
a first light emission element region and a second light emission element region;
a first reflection interface provided in the first light emission element region and the second light emission element region;
a light extraction plane provided in confronted relation to the first reflection interface;
a first light emission layer provided between the first reflection interface and the light extraction plane of the first light emission element region;
a second light emission layer provided between the first reflection interface and the light extraction plane of the second light emission element region;
a second reflection interface provided between the first light emission layer and the light extraction plane, and between the second light emission layer and the light extraction plane, the second reflection interface being configured to allow reflection from the second reflection interface to cause reinforcement with respect to center wavelengths of light emission spectra of the first light emission layer and the second light emission layer;
a third reflection interface provided between the second reflection interface and the light extraction plane, the third reflection interface being configured to allow reflection from the third reflection interface to cause attenuation with respect to the center wavelength of the light emission spectrum of the first light emission layer, and to cause reinforcement with respect to the center wavelength of the light emission spectrum of the second light emission layer; and
a fourth reflection interface provided between the third reflection interface and the light extraction plane, the fourth reflection interface being configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

17. An illumination apparatus, comprising a light emission device,
the light emission device including:
a first light emission element region and a second light emission element region;
a first reflection interface provided in the first light emission element region and the second light emission element region;
a light extraction plane provided in confronted relation to the first reflection interface;
a first light emission layer provided between the first reflection interface and the light extraction plane of the first light emission element region;
a second light emission layer provided between the first reflection interface and the light extraction plane of the second light emission element region;
a second reflection interface provided between the first light emission layer and the light extraction plane, and between the second light emission layer and the light extraction plane, the second reflection interface being configured to allow reflection from the second reflection interface to cause reinforcement with respect to center wavelengths of light emission spectra of the first light emission layer and the second light emission layer;
a third reflection interface provided between the second reflection interface and the light extraction plane, the third reflection interface being configured to allow reflection from the third reflection interface to cause attenuation with respect to the center wavelength of the light emission spectrum of the first light emission layer, and to cause reinforcement with respect to the center wavelength of the light emission spectrum of the second light emission layer; and
a fourth reflection interface provided between the third reflection interface and the light extraction plane, the fourth reflection interface being configured to allow reflection from the fourth reflection interface to cause attenuation with respect to the center wavelength of the light emission spectrum of the first light emission layer, and to cause reinforcement with respect to the center wavelength of the light emission spectrum of the second light emission layer.

* * * * *